(12) United States Patent
    Celestinos

(10) Patent No.: US 11,206,003 B2
(45) Date of Patent: Dec. 21, 2021

(54) PERSONALIZED HEADPHONE EQUALIZATION

(71) Applicant: Samsung Electronics Co., Ltd., Suwon-si (KR)

(72) Inventor: Adrian Celestinos, Porter Ranch, CA (US)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 16/928,751

(22) Filed: Jul. 14, 2020

(65) Prior Publication Data

US 2021/0021250 A1    Jan. 21, 2021

Related U.S. Application Data

(60) Provisional application No. 62/875,595, filed on Jul. 18, 2019.

(51) Int. Cl.
    *H04R 3/00*    (2006.01)
    *H04R 1/10*    (2006.01)
    (Continued)

(52) U.S. Cl.
    CPC .............. *H03G 5/165* (2013.01); *H04R 1/10* (2013.01); *H04R 3/04* (2013.01)

(58) Field of Classification Search
    CPC . H04R 3/00; H04R 3/002; H04R 3/02; H04R 3/04; H04R 1/10; H04R 1/1008; H04R 1/1016; H04R 1/1083; H04R 25/30; H04R 25/40; H04R 25/43; H04R 25/45; H04R 25/48; H04R 25/50; H04R 25/505;
    (Continued)

(56) References Cited

U.S. PATENT DOCUMENTS 5,182,774 A    1/1993  Bourk
8,526,645 B2   9/2013  Boillot et al.
(Continued)

FOREIGN PATENT DOCUMENTS

JP    2013162183 A    8/2013

OTHER PUBLICATIONS

Olive, S., et al., "Listener Preferences for In-Room Loudspeaker and Headphone Target Responses," in Audio Engineering Society Convention 135, Oct. 16, 2013, pp. 1-16, New York, United States.
(Continued)

*Primary Examiner* — Thang V Tran
(74) *Attorney, Agent, or Firm* — Sherman IP LLP; Kenneth L. Sherman; Hemavathy Perumal

(57) ABSTRACT

One embodiment provides a method of personalized headphone equalization system for a headphone. The method comprises obtaining a measurement of sound pressure level at a microphone mounted in a near field of a headphone driver of the headphone and inside a cavity formed by the headphone and a user's ear. The method further comprises providing personalized equalization (EQ) of output reproduced via a headphone driver by performing EQ correction of the output based on the measurement of sound pressure level and a pre-determined target frequency response for the headphone, resulting in an equalized output that is adapted to individual characteristics of the user's ear.

20 Claims, 25 Drawing Sheets

(51) Int. Cl.
*H03G 5/16* (2006.01)
*H04R 3/04* (2006.01)

(58) Field of Classification Search
CPC .... H04R 25/507; H04R 2303/00; H03G 5/00; H03G 5/025; H03G 5/16; H03G 5/165; G03G 3/32; G10K 11/16; G10K 11/172; G10K 11/175
See application file for complete search history.

(56) References Cited

U.S. PATENT DOCUMENTS

| | | | |
|---|---|---|---|
| 9,173,045 B2 | 10/2015 | Bruss et al. | |
| 9,729,957 B1* | 8/2017 | Kaller | G10L 15/22 |
| 9,749,732 B2 | 8/2017 | Liu et al. | |
| 2007/0098187 A1* | 5/2007 | Lee | H04R 5/04 |
| | | | 381/103 |
| 2008/0107287 A1* | 5/2008 | Beard | H04R 1/1016 |
| | | | 381/111 |
| 2010/0002891 A1* | 1/2010 | Shiraishi | H04R 3/02 |
| | | | 381/71.8 |
| 2011/0280411 A1* | 11/2011 | Cheah | G10K 11/17821 |
| | | | 381/71.6 |
| 2014/0254828 A1 | 9/2014 | Ray et al. | |
| 2014/0294191 A1* | 10/2014 | Parkins | A61F 11/14 |
| | | | 381/72 |
| 2015/0010158 A1* | 1/2015 | Broadley | G10K 11/17881 |
| | | | 381/58 |
| 2015/0023515 A1 | 1/2015 | Reimert | |
| 2016/0232889 A1 | 8/2016 | Baker et al. | |
| 2017/0223443 A1 | 8/2017 | Silvestri et al. | |
| 2017/0245045 A1 | 8/2017 | Horbach | |
| 2018/0122400 A1 | 5/2018 | Rasmussen | |
| 2018/0288546 A1 | 10/2018 | Lesso et al. | |
| 2019/0313196 A1* | 10/2019 | Usher | H04R 25/505 |

OTHER PUBLICATIONS

Olive, S., et al., "Listener Preferences for Different Headphone Target Response Curves," in Audio Engineering Society Convention 134, May 4, 2013, pp. 1-12, Rome, Italy.
Olive, S., et al., "A Statistical Model that Predicts Listeners' Preference Ratings of In-Ear Headphones: Part 1—Listening Test Results and Acoustic Measurements," in Audio Engineering Society Convention 143, Oct. 8, 2017, pp. 1-12, New York, United States.
Olive, S., et al., "A Statistical Model that Predicts Listeners' Preference Ratings of In-Ear Headphones: Part 2—Development and Validation of the Model," in Audio Engineering Society Convention 143, Oct. 8, 2017, pp. 1-10, New York, United States.
Olive, S., et al., "A Survey and Analysis of Consumer and Professional Headphones Based on Their Objective and Subjective Performances," in Audio Engineering Society Convention 145, Oct. 7, 2018, pp. 1-13, New York, United States.
International Search Report & Written Opinion dated Oct. 27, 2020 for International Application PCT/KR2020/009421 from Korean Intellectual Property Office, pp. 1-9, Republic of Korea.

* cited by examiner

700

701 — Obtaining a measurement of sound pressure level at a microphone mounted in a near field of a headphone driver of a headphone and inside a cavity formed by the headphone and a user's ear

702 — Providing personalized equalization (EQ) of output reproduced via a headphone driver by performing EQ correction of the output based on the measurement of sound pressure level and a pre-determined target frequency response for the headphone, resulting in an equalized output that is adapted to individual characteristics of the user's ear

FIG. 24

PERSONALIZED HEADPHONE EQUALIZATION

CROSS-REFERENCE TO RELATED APPLICATIONS

This application claims the priority benefit of U.S. Provisional Patent Application Ser. No. 62/875,595, filed Jul. 18, 2019, all incorporated herein by reference in their entirety

TECHNICAL FIELD

One or more embodiments relate generally to headphones, and in particular, personalized headphone equalization.

BACKGROUND

A headphone reproduces audio when connected to a receiver (e.g., a stereo receiver, a surround receiver, etc.), a television (TV) set, a radio, a music player, an electronic sound producing device (e.g., a smartphone), video players, etc.

SUMMARY

One embodiment provides a method of personalized headphone equalization system for a headphone. The method comprises obtaining a measurement of sound pressure level at a microphone mounted in a near field of a headphone driver of the headphone and inside a cavity formed by the headphone and a user's ear. The method further comprises providing personalized equalization (EQ) of output reproduced via a headphone driver by performing EQ correction of the output based on the measurement of sound pressure level and a pre-determined target frequency response for the headphone, resulting in an equalized output that is adapted to individual characteristics of the user's ear.

Another embodiment provides a personalized headphone equalization system for a headphone. The system comprises at least one processor, and a non-transitory processor-readable memory device storing instructions that when executed by the at least one processor causes the at least one processor to perform operations. The operations include obtaining a measurement of sound pressure level at a microphone mounted in a near field of a headphone driver of the headphone and inside a cavity formed by the headphone and a user's ear. The operations further include providing personalized EQ of output reproduced via a headphone driver by performing EQ correction of the output based on the measurement of sound pressure level and a pre-determined target frequency response for the headphone, resulting in an equalized output that is adapted to individual characteristics of the user's ear.

One embodiment provides a headphone device providing personalized headphone equalization. The headphone device comprises a headphone driver, a microphone mounted in a near field of the headphone driver and inside a cavity formed by the headphone device and a user's ear, and a processor. The processor is configured to obtain a measurement of sound pressure level at the microphone. The processor is further configured to provide personalized EQ of output reproduced via a headphone driver by performing EQ correction of the output based on the measurement of sound pressure level and a pre-determined target frequency response for the headphone device, resulting in an equalized output that is adapted to individual characteristics of the user's ear.

These and other features, aspects and advantages of the one or more embodiments will become understood with reference to the following description, appended claims, and accompanying figures.

Figure 15:
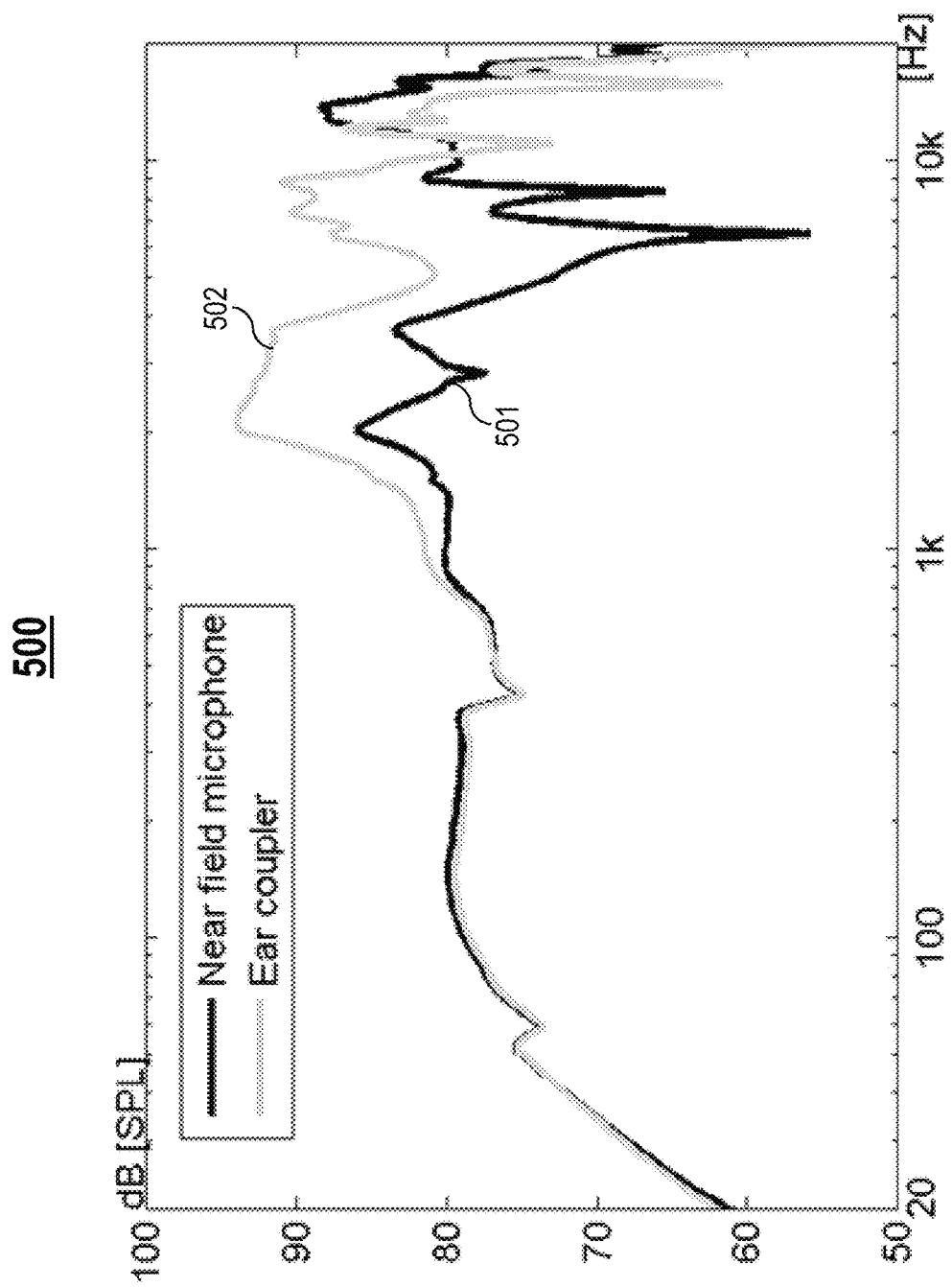
Figure 16:
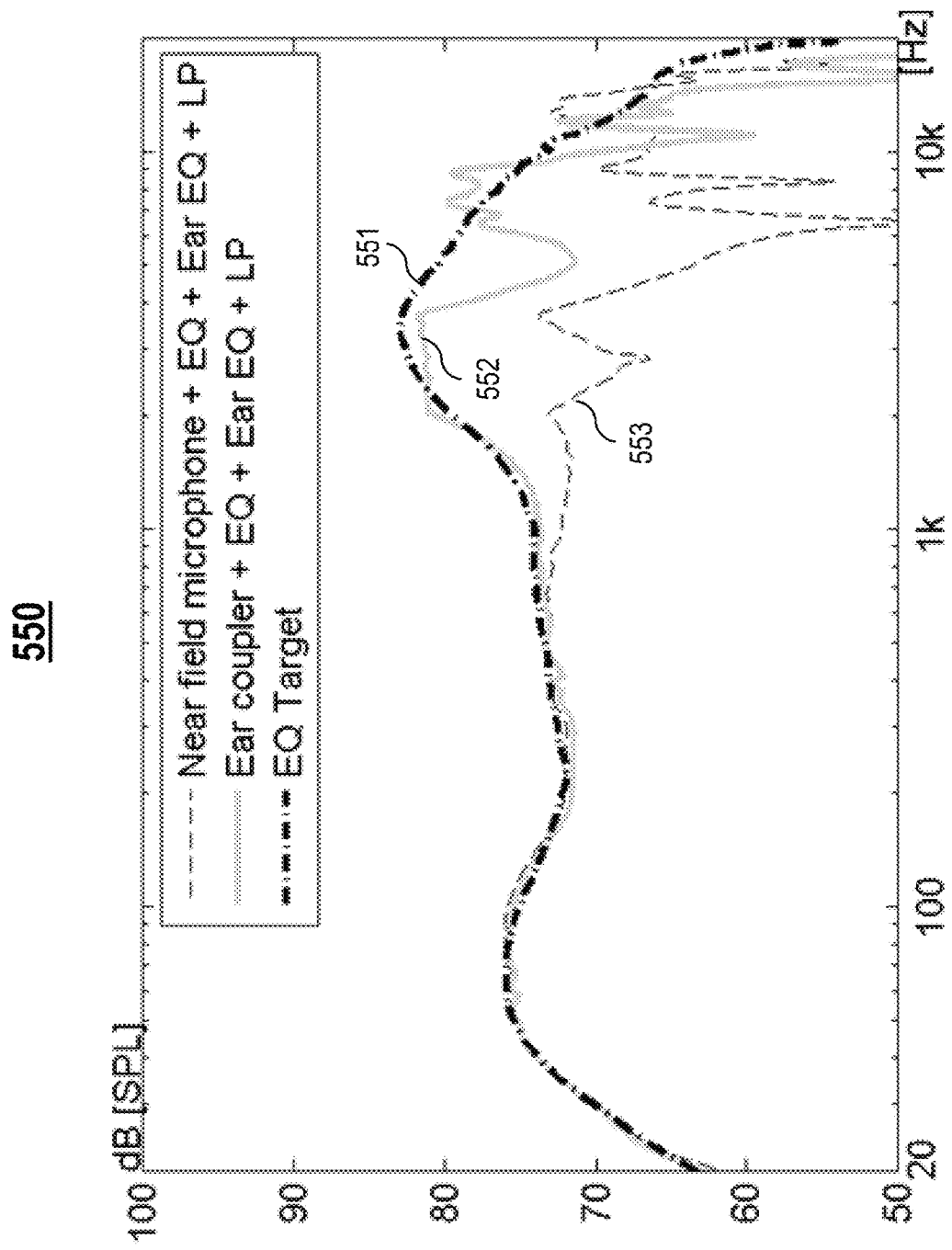
Figure 17:
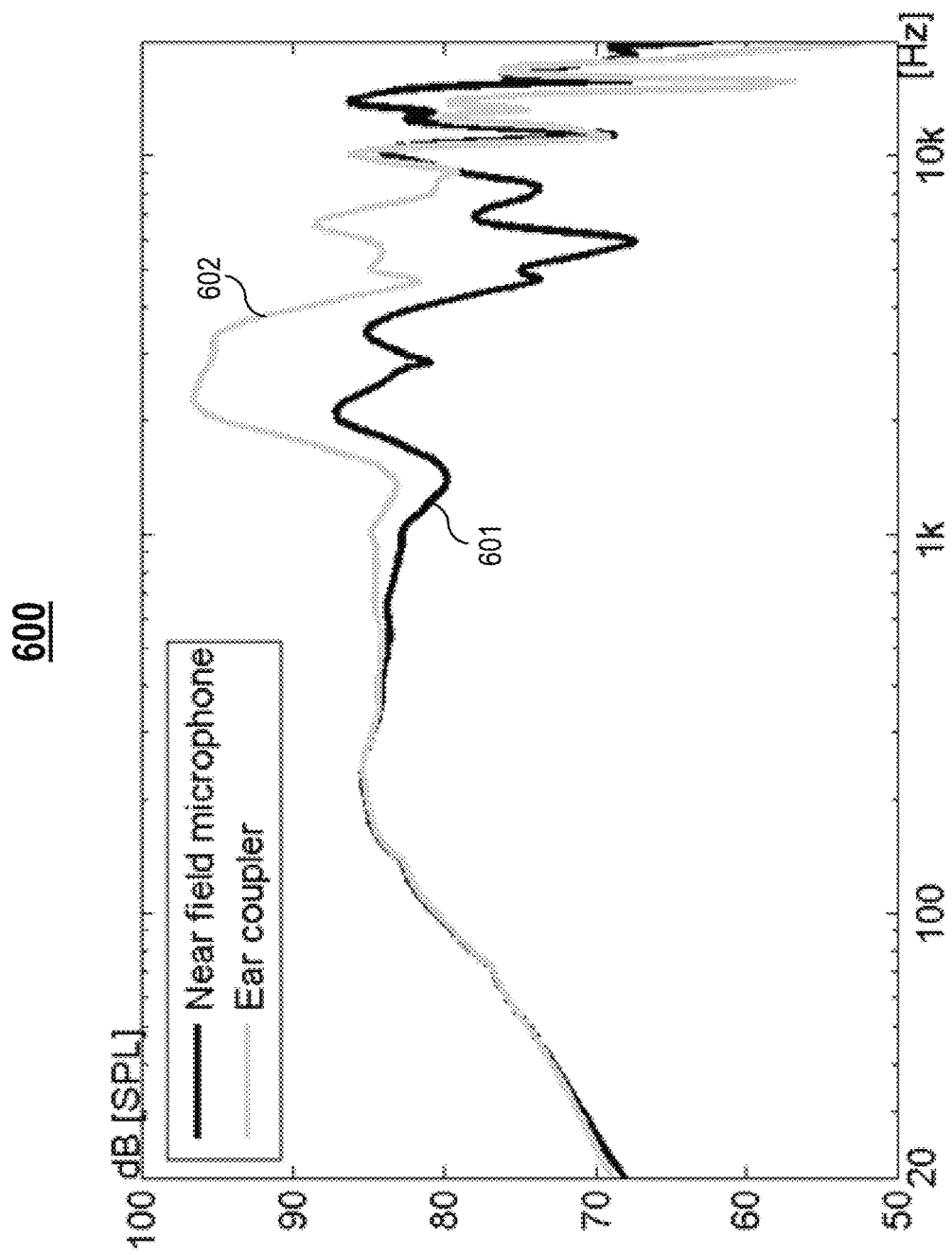
Figure 18:
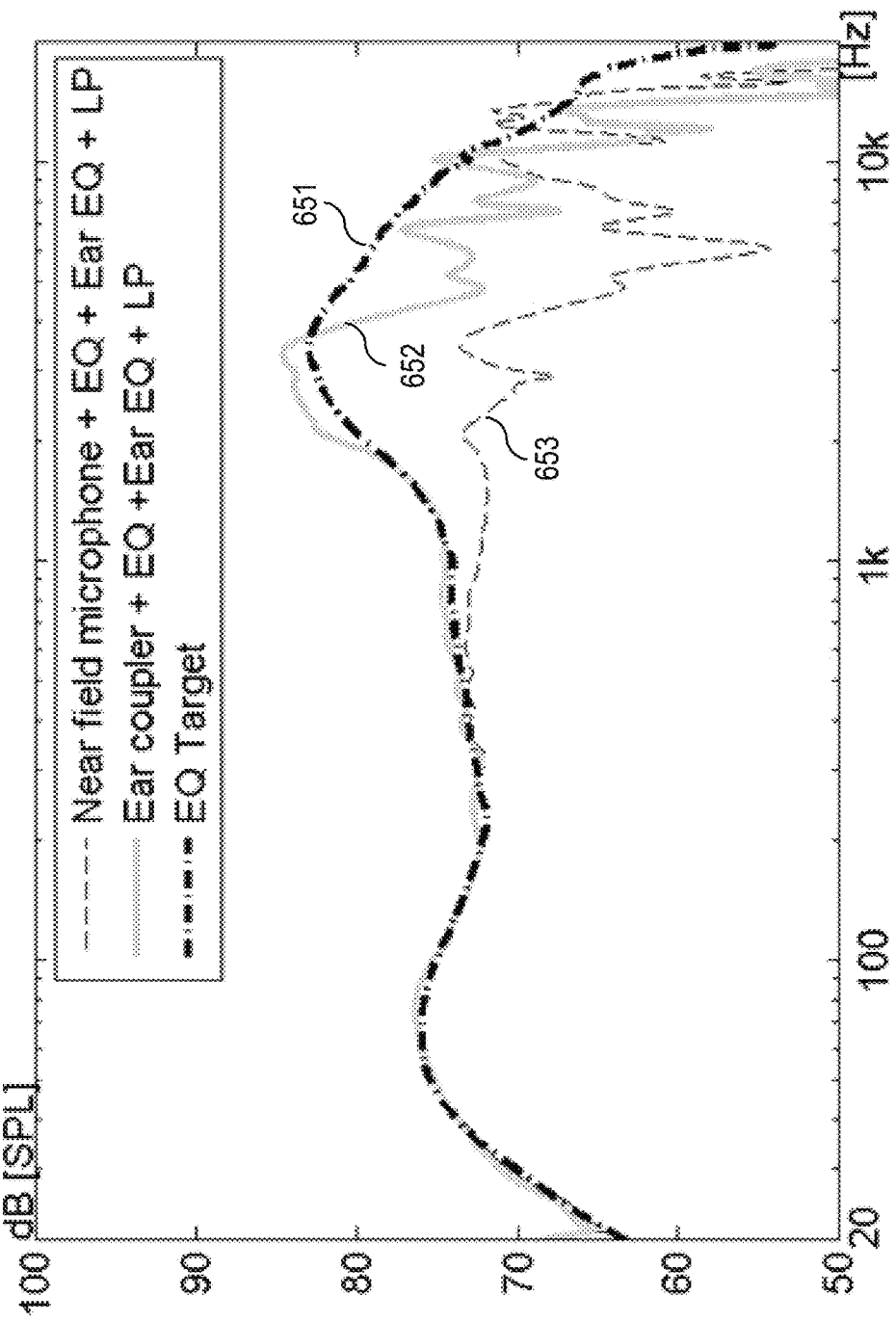
Figure 19:
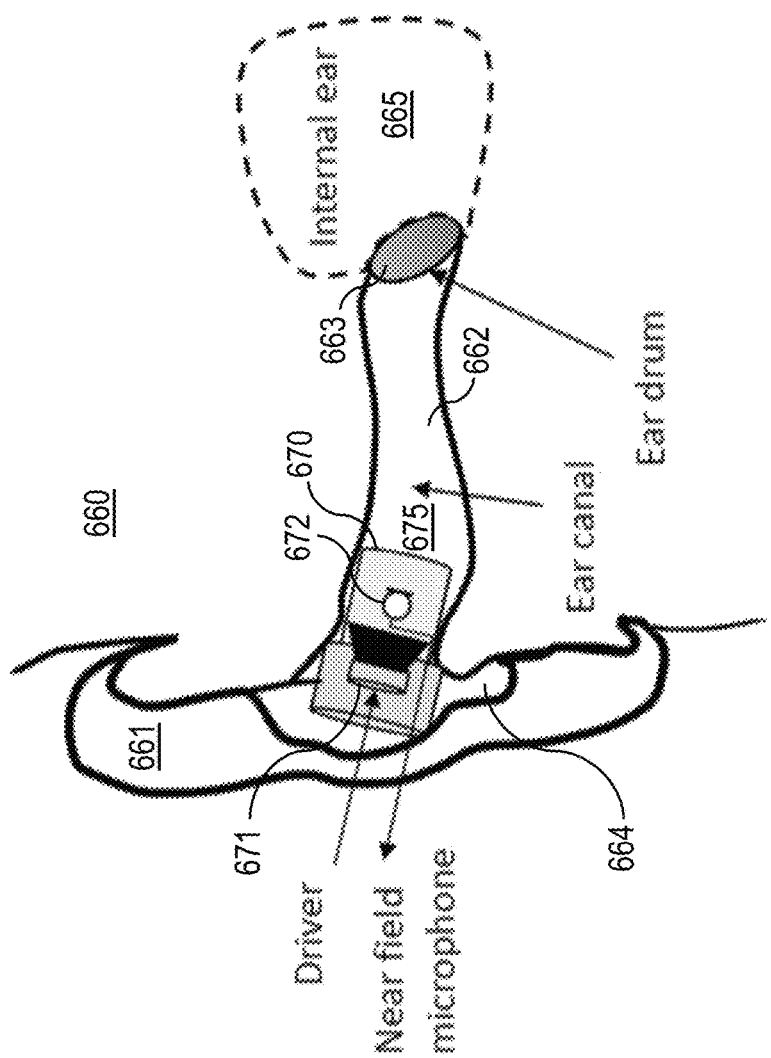
Figure 20:
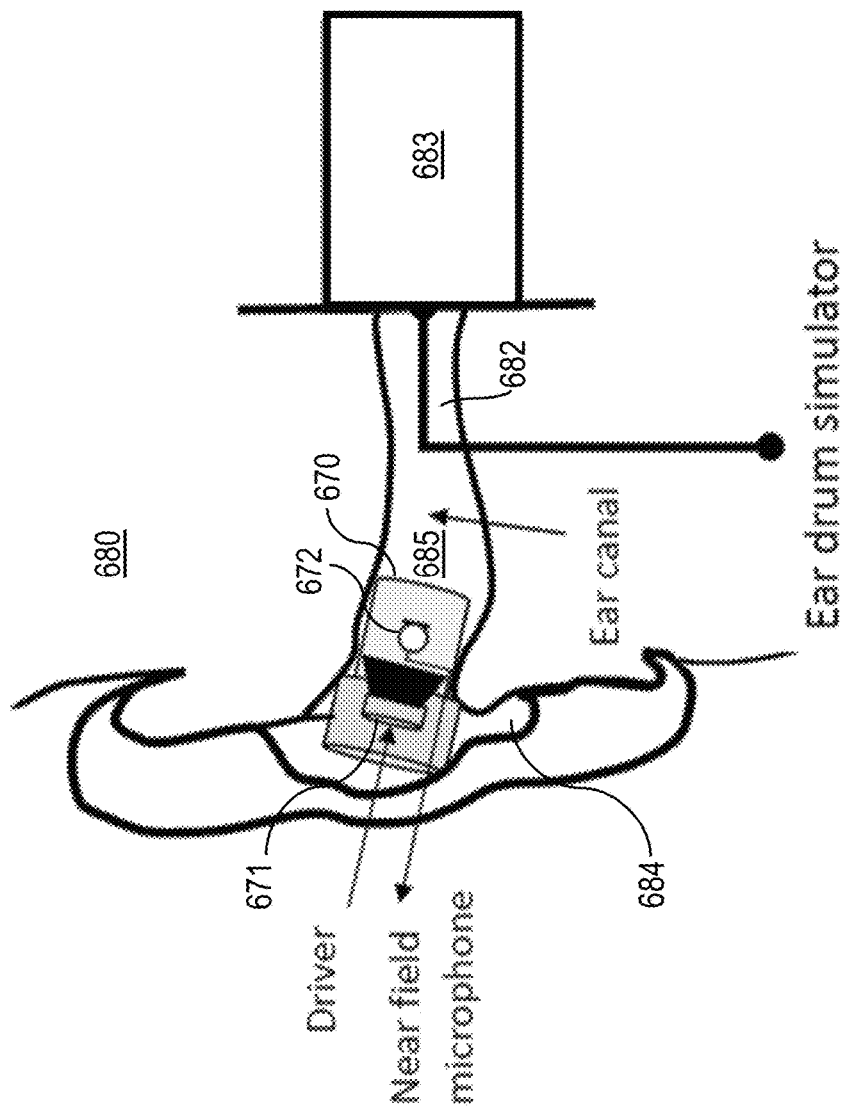
Figure 21:
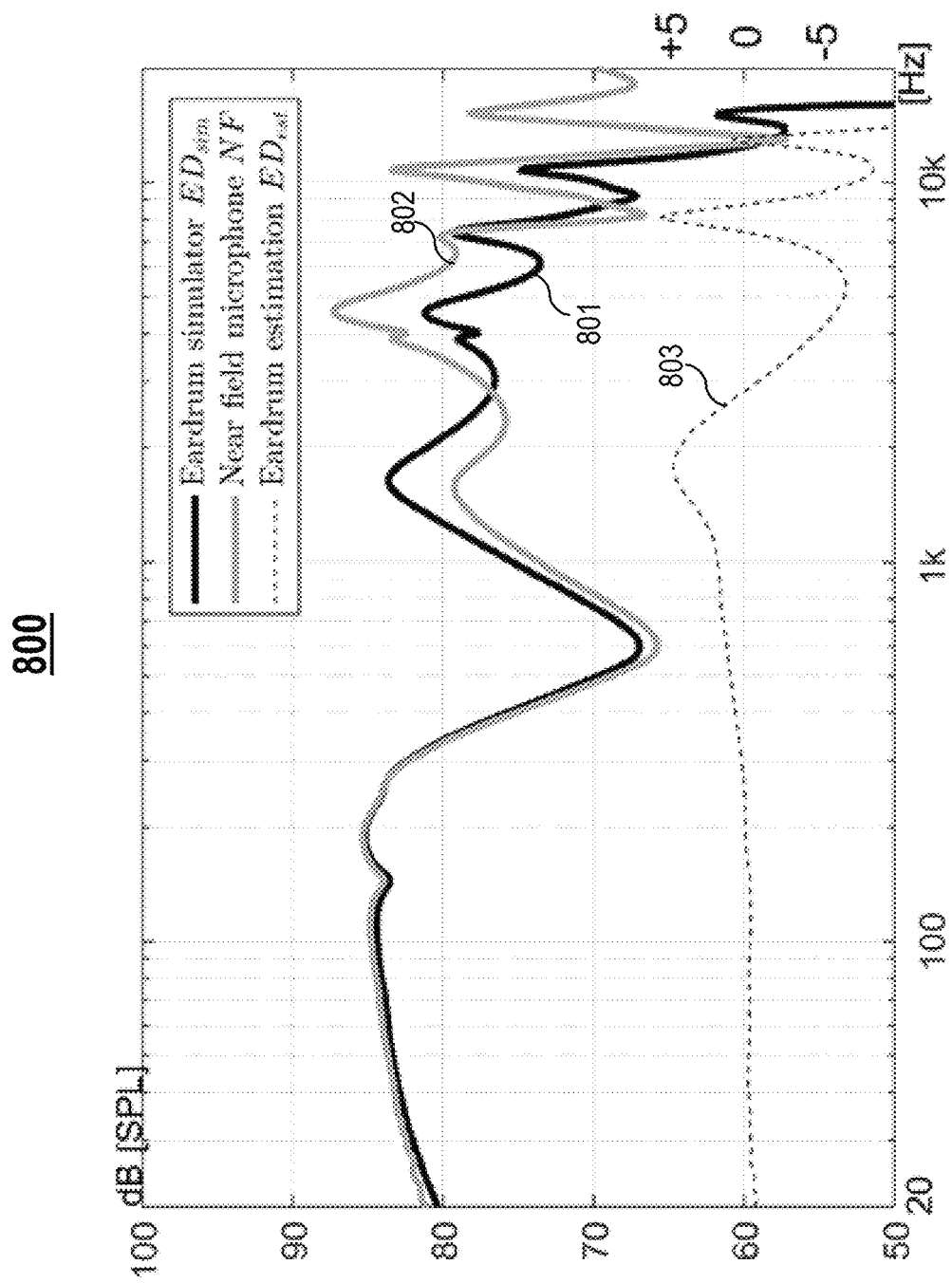
Figure 22:
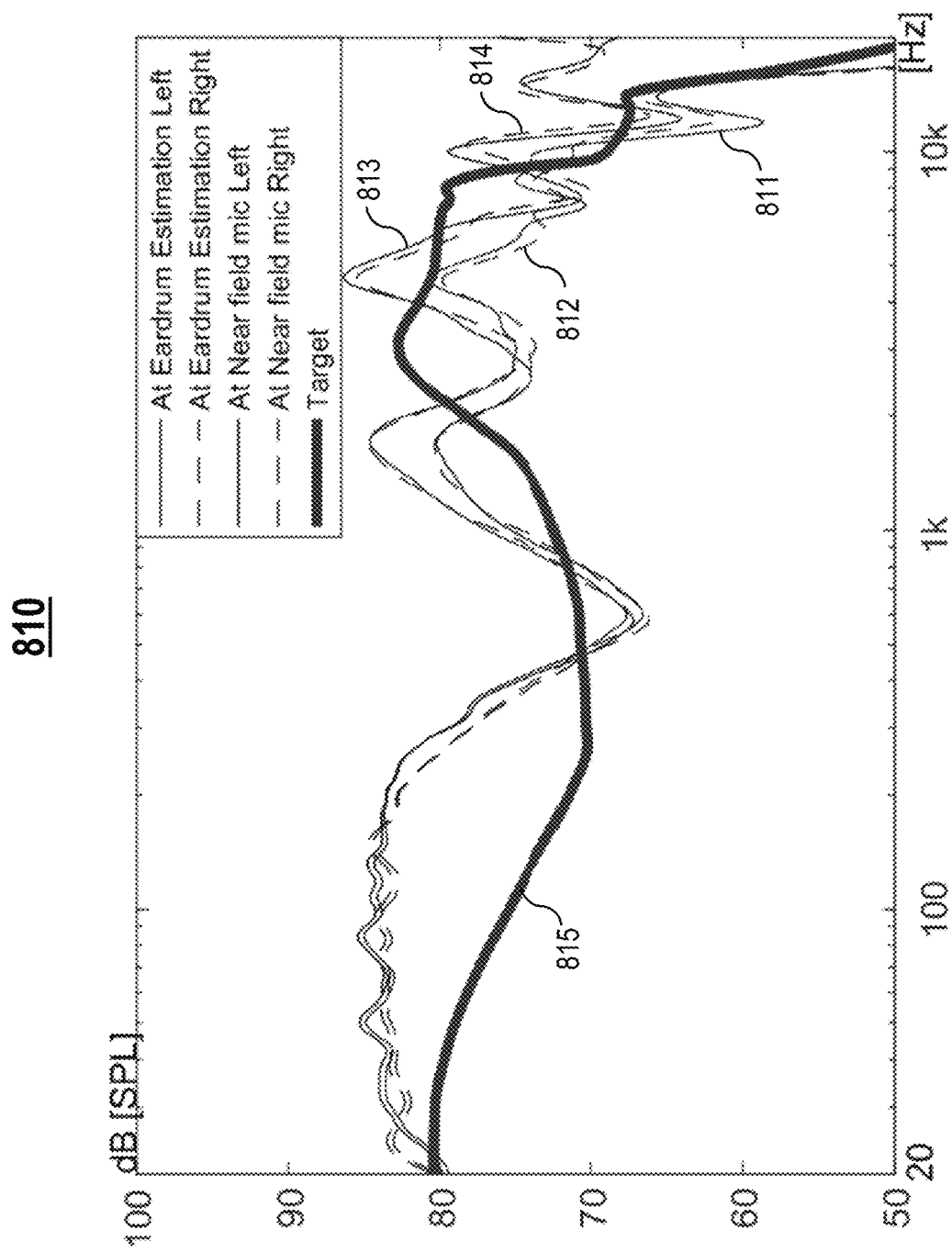
Figure 23:
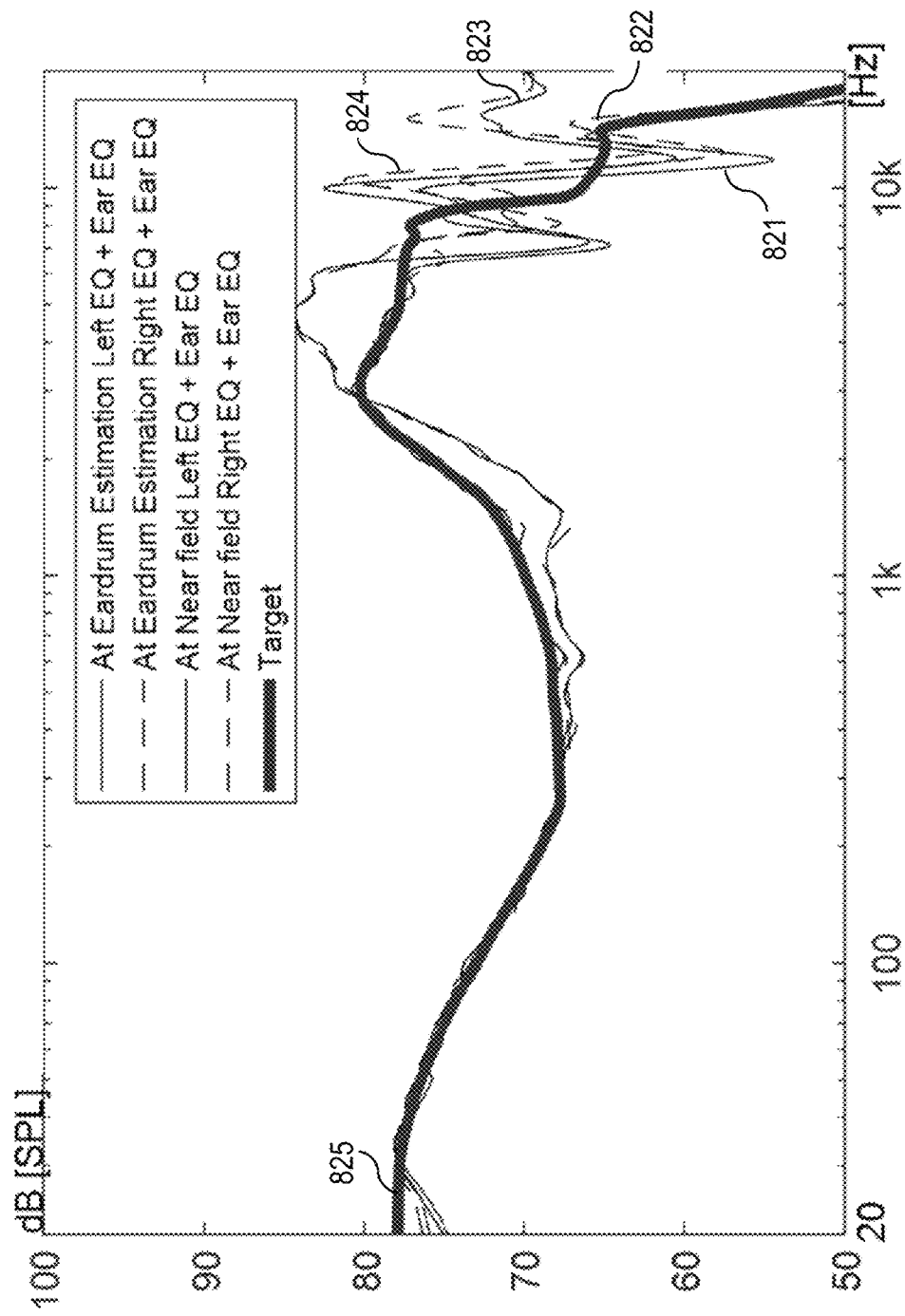
Figure 25:
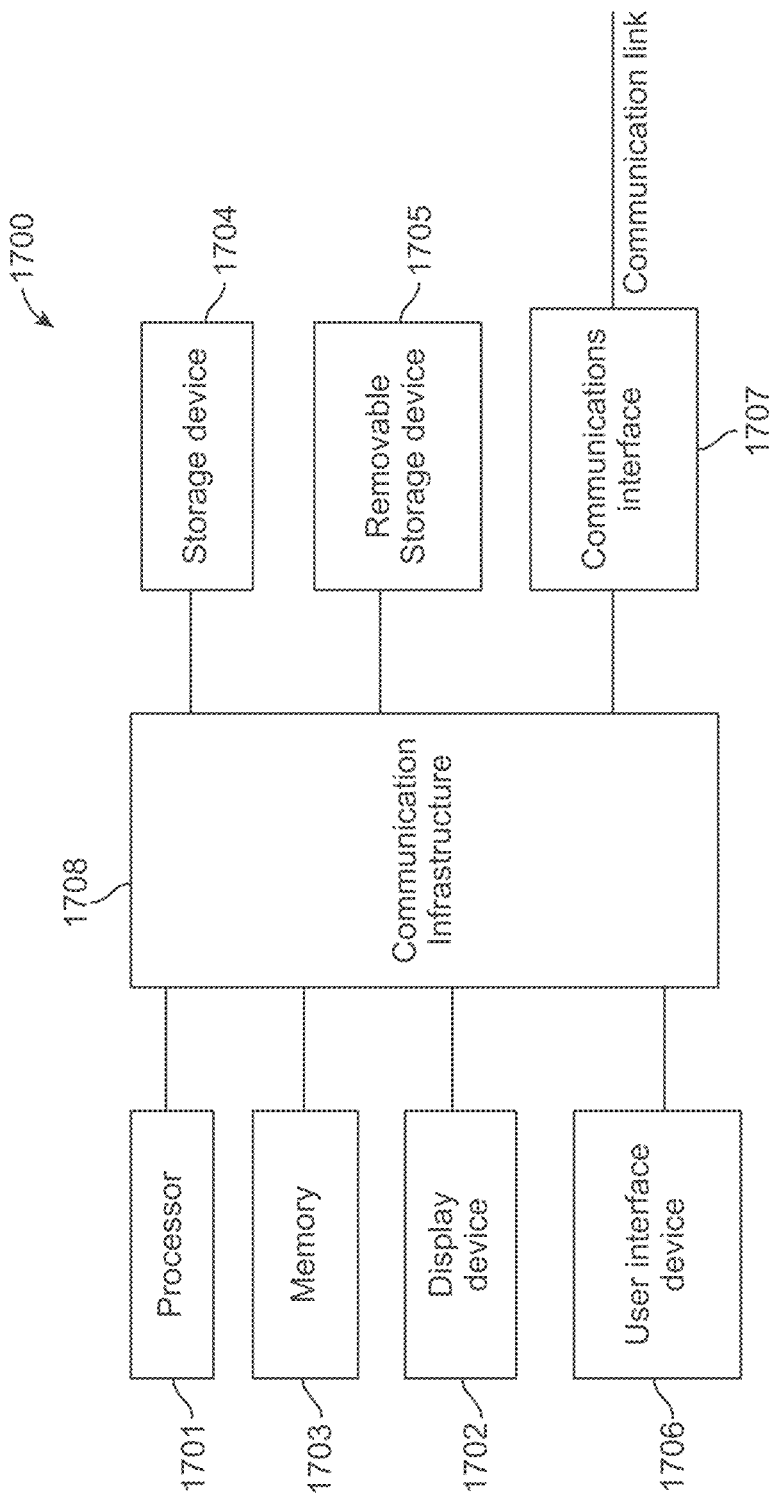

with tight coupling on a head and torso simulator with an artificial ear coupler, after personalized headphone equalization, electro-acoustic system resonance equalization and low pass filtering, in accordance with an embodiment;

FIG. 15 is an example graph illustrating frequency response of the circumaural open-back headphone (FIG. 4) with loose coupling on a head and torso simulator with an artificial ear coupler, in accordance with an embodiment;

FIG. 16 is an example graph illustrating frequency response of a circumaural open-back headphone (FIG. 4) with loose coupling on a head and torso simulator with an artificial ear coupler, after personalized headphone equalization, electro-acoustic system resonance equalization and low pass filtering, in accordance with an embodiment;

FIG. 17 is an example graph illustrating frequency response of a circumaural open-back headphone (FIG. 4) with loose coupling on a head and torso simulator with an artificial ear coupler, after personalized headphone equalization, electro-acoustic system resonance equalization and low pass filtering, in accordance with an embodiment;

FIG. 18 is an example graph illustrating frequency response of a circumaural open-back headphone (FIG. 4) with tight coupling on a head and torso simulator with an artificial ear coupler, after personalized headphone equalization, electro-acoustic system resonance equalization and low pass filtering, in accordance with an embodiment;

FIG. 19 illustrates an example in-ear earbud inserted into a human ear of a human user/person, wherein the system is integrated in the in-ear earbud or operates on an electronic device connected to the in-ear earbud, in accordance with an embodiment;

FIG. 20 illustrates the example in-ear earbud inserted into a head and torso simulator, in accordance with an embodiment;

FIG. 21 is an example graph illustrating frequency response of the in-ear earbud (FIG. 20) when inserted into the head and torso simulator, in accordance with an embodiment;

FIG. 22 is an example graph illustrating a pre-determined target frequency response for the in-ear earbud (FIG. 19) when inserted into the human ear, in accordance with an embodiment;

FIG. 23 is an example graph illustrating equalized frequency response of the in-ear earbud (FIG. 19) when inserted into the human ear, in accordance with an embodiment;

FIG. 24 is an example flowchart of a process for personalized headphone equalization, in accordance with an embodiment; and FIG. 25 is a high-level block diagram showing an information processing system comprising a computer system useful for implementing various disclosed embodiments.

DETAILED DESCRIPTION

The following description is made for the purpose of illustrating the general principles of one or more embodiments and is not meant to limit the inventive concepts claimed herein. Further, particular features described herein can be used in combination with other described features in each of the various possible combinations and permutations. Unless otherwise specifically defined herein, all terms are to be given their broadest possible interpretation including meanings implied from the specification as well as meanings understood by those skilled in the art and/or as defined in dictionaries, treatises, etc.

One embodiment provides a method of personalized headphone equalization system for a headphone. The method comprises obtaining a measurement of sound pressure level at a microphone mounted in a near field of a headphone driver of the headphone and inside a cavity formed by the headphone and a user's ear. The method further comprises providing personalized equalization (EQ) of output reproduced via a headphone driver by performing EQ correction of the output based on the measurement of sound pressure level and a pre-determined target frequency response for the headphone, resulting in an equalized output that is adapted to individual characteristics of the user's ear.

Another embodiment provides a personalized headphone equalization system for a headphone. The system comprises at least one processor, and a non-transitory processor-readable memory device storing instructions that when executed by the at least one processor causes the at least one processor to perform operations. The operations include obtaining a measurement of sound pressure level at a microphone mounted in a near field of a headphone driver of the headphone and inside a cavity formed by the headphone and a user's ear. The operations further include providing personalized EQ of output reproduced via a headphone driver by performing EQ correction of the output based on the measurement of sound pressure level and a pre-determined target frequency response for the headphone, resulting in an equalized output that is adapted to individual characteristics of the user's ear.

One embodiment provides a headphone device providing personalized headphone equalization. The headphone device comprises a headphone driver, a microphone mounted in a near field of the headphone driver and inside a cavity formed by the headphone device and a user's ear, and a processor. The processor is configured to obtain a measurement of sound pressure level at the microphone. The processor is further configured to provide personalized EQ of output reproduced via a headphone driver by performing EQ correction of the output based on the measurement of sound pressure level and a pre-determined target frequency response for the headphone device, resulting in an equalized output that is adapted to individual characteristics of the user's ear.

There are different types of headphones such as, but not limited to, circumaural (i.e., around the ear) headphones, supra-aural (i.e., over the ear) headphones, closed-back headphones, open-back headphones, in-ear earbuds (i.e., earphones), bone conduction headphones, headsets, etc. Each headphone comprises a headphone driver (i.e., transducer) for reproducing sound, wherein the headphone driver is disposed inside a housing of the headphone. For example, if the headphone is a circumaural headphone or a supra-aural headphone, the headphone driver is disposed inside a can for covering an external part of a user's ear. As another example, if the headphone is an in-ear earbud, the headphone driver is disposed inside the earbud for insertion into an ear canal of a user's ear.

Many conventional headphones include noise cancellation systems that utilize microphones and real-time digital signal processing (DSP) to sense (i.e., measure) noise inside of and/or outside of the headphones for purposes of canceling or reducing the noise sensed as much as possible.

Embodiments of the invention can be integrated in headphones with active noise control (ANC) or noise cancelation systems. Embodiments of the invention can be integrated in virtual reality systems that utilize headphones. Embodiments of the invention provide a solution to issues of variability arising from placement and/or positioning of headphones to a user's ears, specifically providing correction of output of the headphones in accordance with individual characteristics of the user.

Figure 1:
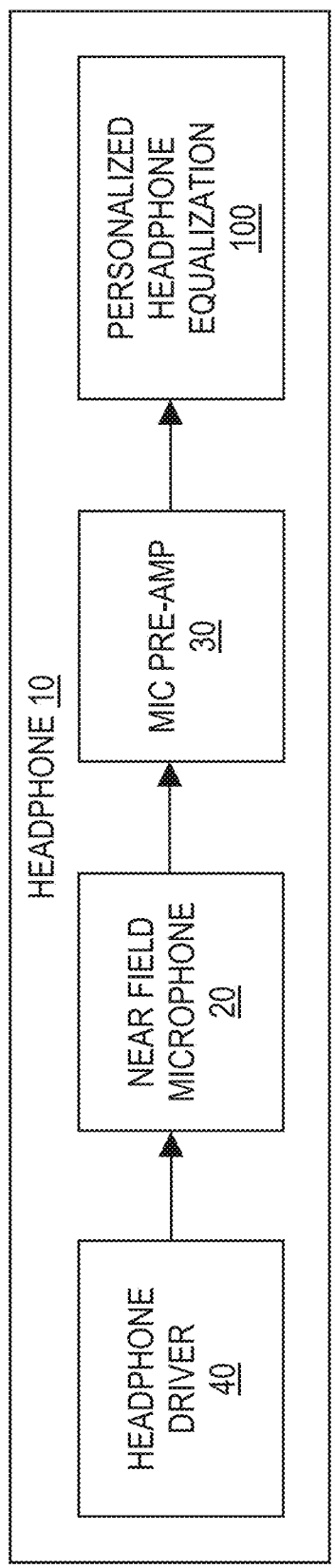
FIG. 1 illustrates an example personalized headphone equalization system for a headphone, in accordance with an embodiment.

FIG. 1 illustrates an example personalized headphone equalization system 100 for a headphone 10, in accordance with an embodiment. In one embodiment, the system 100 is configured to provide personalized (i.e., customized) equalization of output reproduced via a headphone driver 40 of the headphone 10 by automatically adapting the output based on individual characteristics of user's ear that the headphone 10 is placed and/or positioned relative to.

In one embodiment, the system 100 is integrated in headphones that include the headphone 10. For example, in one embodiment, the system 100 is included in digital signal processing (DSP) of an ANC or a noise cancelation system for the headphones. In another embodiment, the headphone 10 is connected to an electronic device such as a mobile device (e.g., a smartphone), a PC, etc., and the system 100 operates on the electronic device.

The system 100 is suitable for different types of headphones such as, but not limited to, circumaural headphones, supra-aural headphones, in-ear earbuds, bone conduction headphones, etc. The headphone 10 can be any type of headphone that includes a microphone 20 (e.g., a built-in miniature microphone) mounted in the near field of the headphone driver 40 and inside a cavity formed from the headphone 20 and the user's ear including ear canal. The cavity encompasses different spatial points, such as the headphone driver 40, the microphone 20, the ear canal open to an external part of the user's ear, an eardrum at an end of the ear canal, etc. The microphone 20 is configured to sense (i.e., measure) sound pressure level inside the cavity at discrete frequencies. In one embodiment, the microphone 20 is configured to perform a real-time measurement of a transfer function from electrical/voltage terminals of the headphone driver 40 to a point inside the cavity. For example, in one embodiment, the microphone 20 is configured to compute an impulse response representing the transfer function from the electrical/voltage terminals of the headphone driver 40 to the microphone 20.

As described in detail later herein, in one embodiment, the system 100 is configured to: (1) receive a real-time measurement of sound pressure level at the microphone 20 (i.e., sound pressure level sensed by the microphone 20), (2) determine a degree of acoustical coupling of the headphone 10 to the user's ear based on the measurement, and (3) apply personalized EQ correction to output reproduced via the headphone driver 40 to improve or increase sound quality of the headphone 10. The degree of acoustical coupling enables the user to determine how well the headphone 10 is coupled (i.e., attached) to the user's ear, and provides an automatic measurement of acoustical leakages resulting from the coupling.

In one embodiment, sound pressure level sensed by the microphone 20 is amplified via a mic pre-amp 30 of the headphone 10.

Embodiments of the invention provide several advantages such as, but not limited to, an automatic measurement of acoustical leakages resulting from coupling of headphones to a user's ears, correction for the acoustical leakages at low frequencies, EQ correction of output reproduced by the headphones to a pre-determined target EQ for the headphones, personalized equalization of the output from 20 Hz to approximately 1500 Hz, improved or increased sound quality of the headphones including bass reproduction, improved sound balance between left and right cans or earbuds of the headphones, alerts in response to prolonged exposure of the user's ears to high sound pressure levels, etc.

Figure 2:
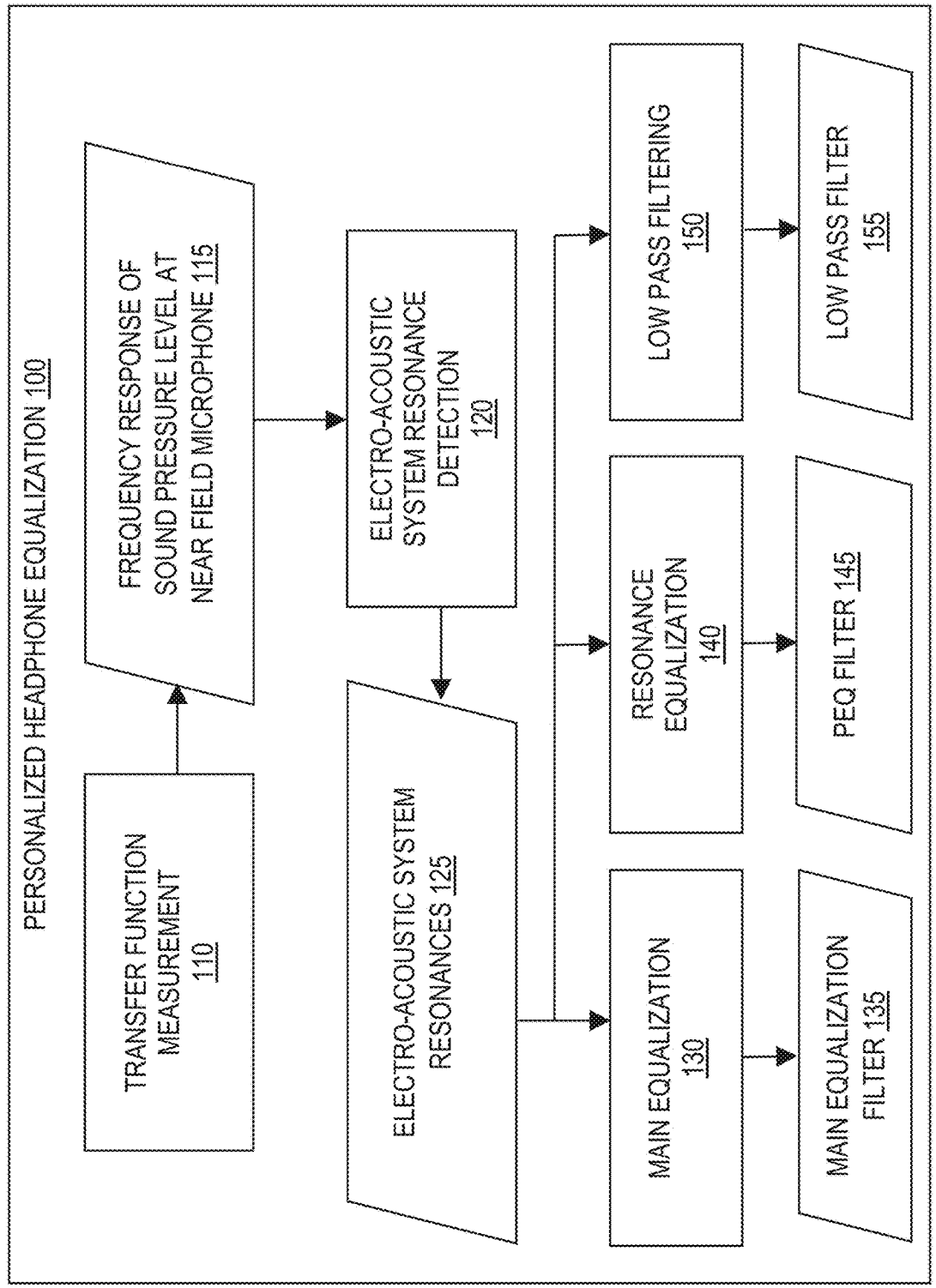
FIG. 2 illustrates the personalized headphone equalization system in detail, in accordance with an embodiment.

FIG. 2 illustrates the personalized headphone equalization system 100 in detail, in accordance with an embodiment. In one embodiment, the system 100 comprises a transfer function measurement unit 110 configured to: (1) receive a signal indicative that the headphone 10 is turned on, (2) perform a real-time measurement of a transfer function from electrical terminals of the headphone driver 40 to a point inside the cavity formed by the headphone 10 and the user's ear including ear canal, and (3) determine a degree of acoustical coupling of the headphone 10 to individual characteristics of the user's ear based on the real-time measurement of the transfer function. The degree of acoustical coupling provides an automatic measurement of acoustical leakages resulting from coupling the headphone to the user's ear.

In one embodiment, the real-time measurement of the transfer function involves utilizing the microphone 20 to sense sound pressure level inside the cavity, resulting in measurement data 115 comprising a frequency response of sound pressure level at the microphone 20.

In one embodiment, the real-time measurement of the transfer function is based on different methods such as, but not limited to, using a test signal (e.g., a music program), using a logarithmic sweep method, using a multi-tone method, using maximum length sequences (MLS) sequences, etc.

If the headphone 10 is a circumaural headphone or a supra-aural headphone, a volume of the cavity formed from covering an external (i.e., outer) part of the user's ear with a can of the headphone 10 is small relative to frequency wavelengths below approximately 1500 Hz. Below these frequencies, the cavity will act as a pressure chamber where sound pressure is the same at any point inside the cavity. In one embodiment, the system 100 provides an accurate estimation of sound pressure levels reproduced inside the cavity based on information relating to sensitivities of the headphone driver 40 and the microphone 20.

Resonances in an ear canal ("ear canal resonances") of a user's ear typically fluctuates from 2000 Hz to 4000 Hz due to the individual characteristics of the user's ear, such as size, volume, and length. A frequency response of sound pressure level at the microphone 20 allows for detection of electro-acoustic system resonances including ear canal resonances and/or headphone driver resonances, all formed inside the cavity by the headphone driver 40 and the user's ear. Let $f_r$ generally denote a frequency at which a resonance is detected in the frequency response.

In one embodiment, the system 100 comprises an electro-acoustic system resonance detection unit 120 configured to detect one or more resonances (e.g., ear canal resonances and/or headphone driver resonances) based on a frequency response of sound pressure level at the microphone 20 (e.g., measurement data 115 from the transfer function measurement unit 110). For example, in one embodiment, the electro-acoustic system resonance detection unit 120 is configured to detect a resonance in a portion of the frequency response that spans a pre-determined frequency range (e.g., from about 1000 Hz to about 3000 Hz) by detecting a maximum sound pressure level of the portion, wherein the maximum sound pressure level is a peak in the portion.

In one embodiment, the electro-acoustic system resonance detection unit 120 is configured to detect a different amount (i.e., number) of electro-acoustic system resonances in the frequency response for different types of headphone.

In one embodiment, the electro-acoustic system resonance detection unit 120 is configured to determine a gain and a quality factor (Q) for a resonance detected. Let $g_r$ generally denote a gain for a resonance detected at a frequency $f_r$. For example, in one embodiment, the electro-acoustic system resonance detection unit 120 is configured to detect a gain $g_{r1}$ and a Q for a first electro-acoustic system resonance detected at a frequency $f_{r1}$. As another example, in one embodiment, the electro-acoustic system resonance detection unit 120 is configured to detect a gain and a Q for a subsequent electro-acoustic system resonance detected instead (e.g., a second electro-acoustic system resonance detected at a frequency $f_{r2}$); this example is suitable for a type of headphone that is more rigid (e.g., the headphone driver 40 is surrounded by hardware).

In one embodiment, the electro-acoustic system resonance detection unit 120 provides data 125 comprising: (1) for each electro-acoustic system resonance detected, a corresponding frequency $f_r$ at which the electro-acoustic system resonance is detected in the frequency response, and (2) a gain $g_r$ and a Q for either a first electro-acoustic system resonance detected or a subsequent electro-acoustic system response detected, if any.

In one embodiment, the system 100 comprises a main equalization unit 130 configured to provide personalized EQ correction (i.e., personalized headphone equalization) of output reproduced via the headphone driver 40 in accordance with a pre-determined target frequency response for the headphone 10. Specifically, in one embodiment, the main equalization unit 130 is configured to: (1) construct (i.e., create) a main equalization filter 135 based on the pre-determined target frequency response, a frequency response of sound pressure level at the microphone 20 (e.g., measurement data 115 from the transfer function measurement unit 110), and an electro-acoustic system resonance detected (e.g., data 125 from the electro-acoustic system resonance detection unit 120), and (2) provide equalization by using the main equalization filter to equalize a frequency response of the headphone 10, resulting in an equalized frequency response that closely matches the pre-determined target response.

In one embodiment, the pre-determined target frequency response is based on subjective evaluations on human subjects.

In one embodiment, a main equalization filter 135 constructed by the main equalization unit 130 is based on different methods such as, but not limited to, using infinite impulse response (IIR) filters with a number of bi-quads or parametric equalization (PEQ) filters that can be combined with a minimum phase finite impulse response filter (FIR), etc.

Let $EQ_{main}$ generally denote a main equalization filter 135 constructed by the main equalization unit 130. In one embodiment, for a frequency bandwidth from dc to 20 Hz, no equalization is performed, as represented by equation (1) in dB provided below:

$$EQ_{main}(f_{dc} \text{ to } f_{20})=0 \qquad (1).$$

In one embodiment, for a frequency bandwidth from 20 Hz to a frequency $f_r$ at which an electro-acoustic system resonance is detected, the main equalization filter $EQ_{main}$ is represented in accordance with equation (2) provided below:

$$EQ_{main}(f_{20} \text{ to } f_r)=(TG+TG_{norm})-H_{near\,field} \qquad (2),$$

wherein TG denotes a pre-determined target EQ for the headphone 10 in decibels (dB), $TG_{norm}$ denotes a normalization of a pre-determined target gain in dB, and $H_{near\,field}$ denotes a sound pressure level at the microphone 20. The main equalization filter $EQ_{main}$ is applied to provide individualized headphone equalization from 20 Hz to the frequency $f_r$ to improve sound quality of output reproduced via the headphone driver 40.

In one embodiment, for a frequency bandwidth from the frequency $f_r$ to 20000 Hz, the main equalization filter $EQ_{main}$ is represented in accordance with equation (3) provided below:

$$EQ_{main}(f_r \text{ to } f_{20K})=EQ_{main}(f_r) \qquad (3).$$

A frequency response of the main equalization filter $EQ_{main}$ is equal to a constant value from the frequency $f_r$ to 20000 Hz.

In one embodiment, the system 100 comprises a resonance equalization unit 140 configured to provide additional EQ correction of output reproduced via the headphone driver 40 to compensate for an electro-acoustic system resonance (e.g., ear canal resonance and/or a headphone driver resonance) detected at a frequency $f_r$. Specifically, in one embodiment, the resonance equalization unit 140 is configured to: (1) construct (i.e., create) a PEQ filter 145 centered on the frequency $f_r$ with an approximate gain $g_r$ (e.g., −6 dB) and a low Q (e.g., Q=1.5) for the resonance detected (e.g., based on data 125 from the electro-acoustic system resonance detection unit 120), and (2) provide additional equalization to compensate for the resonance detected (i.e., electro-acoustic system resonance equalization, such as ear canal resonance equalization) by adding the PEQ filter 145 to the main equalization filter 135.

Let $PEQ_{fr}$ generally denote a PEQ filter 145 constructed by the resonance equalization unit 140 to compensate for a resonance detected at a frequency $f_r$.

In one embodiment, the main equalization filter $EQ_{main}$ and the PEQ filter $PEQ_{fr}$ are based on a frequency $f_{r1}$ at which a first resonance is detected (i.e., $f_r=f_{r1}$). In another embodiment, the main equalization filter $EQ_{main}$ and the PEQ filter $PEQ_{fr}$ are based on a frequency at which a subsequent resonance (e.g., a second resonance) is detected (e.g., $f_r=f_{r2}$).

In one embodiment, the system 100 comprises a low pass filtering unit 150 configured to provide low pass filtering to reduce one or more high peaks in a frequency response of the headphone 10 at frequencies above 10000 Hz. Specifically, in one embodiment, low pass filtering unit 150 is configured to: (1) construct (i.e., create) a first order low pass filter 155 with at a pre-determined cut off frequency $f_c$ (e.g., 6500 Hz), and (2) provide the low pass filtering by adding the low pass filter 155 to the main equalization filter 135. The low pass filter 155 is adjustable based on user preferences.

Let $LP_{fc}$ generally denote a low pass filter 155 constructed by the low pass filtering unit 150 with at a pre-determined cut off frequency $f_c$. In one embodiment, the pre-determined cut off frequency $f_c$ is based on user input. For example, in one embodiment, the pre-determined cut off frequency $f_c$ is equal to a frequency $f_{r2}$ at which a second resonance is detected in the frequency response. As another example, the pre-determined cut off frequency $f_c$ is equal to a frequency $f_{r1}$ at which a first resonance is detected in the frequency response.

Let $EQ_{ear}$ generally denote an amount of additional equalization and low pass filtering applied to a frequency response of the headphone 10. In one embodiment, $EQ_{ear}$ is represented in accordance with equation (4) provided below:

$$EQ_{ear}=PEQ_{fr}+LP \qquad (4).$$

Let $EQ_{final}$ generally denote a final (i.e., total) amount of equalization and low pass filtering applied to a frequency response of the headphone 10. In one embodiment, $EQ_{final}$ is represented in accordance with equation (5) provided below:

$$EQ_{final} = EQ_{main} + EQ_{ear} \qquad (5).$$

In one embodiment, each individual filter (e.g., the main equalization filter $EQ_{main}$, the PEQ filter $PEQ_{fr}$, and the low pass filter $LP_{fc}$) is calculated and/or adapted by a DSP processor. An initial routine can be used to perform a measurement using different types of test signals, multi-tones, pink noise, etc. For example, in one embodiment, the system 100 implements an adaptive process using a music program as a test signal. The adaptive process can be based on different techniques for real-time adaptive transfer function measurement, such as using Kalman filters, using Least Squares Spectral Approximation, etc. Once each individual filter is constructed, the system 100 runs a periodic routine to update the individual filter in case the headphone 10 has been moved to a slightly different position, therefore changing its coupling to the user's ear.

Figure 3:
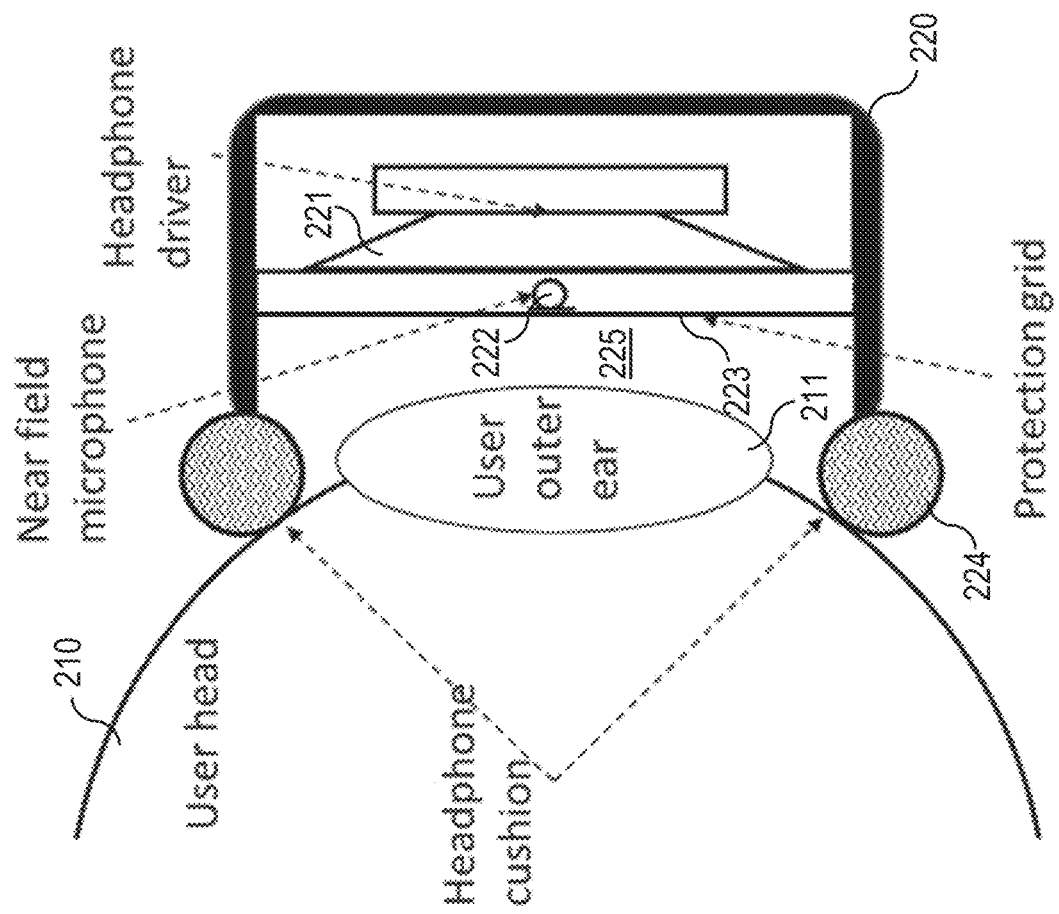
FIG. 3 illustrates an example circumaural closed-back headphone on a user's head, wherein the system is integrated in the headphone or operates on an electronic device connected to the headphone, in accordance with an embodiment.

FIG. 3 illustrates an example circumaural closed-back headphone 220 on a user's head 210, wherein the system 100 is integrated in the headphone 220 or operates on an electronic device connected to the headphone 220, in accordance with an embodiment. As shown in FIG. 3, a cavity 225 is formed from the headphone 220 covering an external (i.e., outer) ear part 211 of the user's head 210. The headphone 220 comprises: (1) a headphone driver 221 for reproducing audio, (2) a protection grid 223 separating the headphone driver 221 from the external ear part 211, (3) a headphone cushion 224 completely surrounding the external ear part 211, such that the headphone 220 fully encloses the external ear part 211, and (4) a near field microphone 222 for sensing sound pressure levels inside the cavity 225 at discrete frequencies. In one embodiment, the microphone 222 is mounted in the near field of a diaphragm of the headphone driver 221 by mounting the microphone 222 at the protection grid 223.

Figure 4:
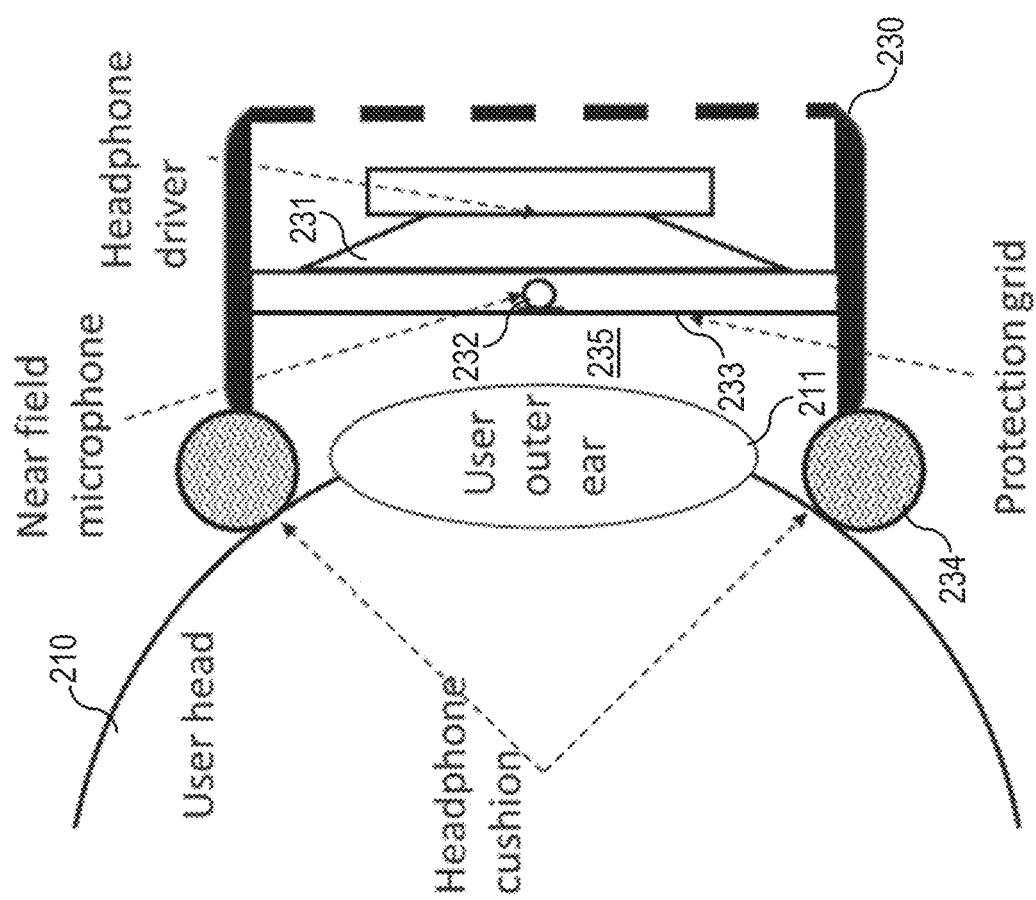
FIG. 4 illustrates an example circumaural open-back headphone on a user's head, wherein the system is integrated in the headphone or operates on an electronic device connected to the headphone, in accordance with an embodiment.

FIG. 4 illustrates an example circumaural open-back headphone 230 on a user's head 210, wherein the system 100 is integrated in the headphone 230 or operates on an electronic device connected to the headphone 230, in accordance with an embodiment.

As shown in FIG. 4, a cavity 235 is formed from the headphone 230 covering an external (i.e., outer) ear part 211 of the user's head 210. The headphone 230 comprises: (1) a headphone driver 231 for reproducing audio, (2) a protection grid 233 separating the headphone driver 231 from the external ear part 211, (3) a headphone cushion 234 completely surrounding the external ear part 211, such that the headphone 230 fully encloses the external ear part 211, and (4) a near field microphone 232 for sensing sound pressure levels inside the cavity 235 at discrete frequencies. In one embodiment, the microphone 232 is mounted in the near field of a diaphragm of the headphone driver 231 by mounting the microphone 232 at the protection grid 233.

Design features of headphones and physical characteristics of a user's head and ears affects a degree of acoustical coupling of the headphones to the user's ears. For example, if the headphones are circumaural headphones or supra-aural headphones, the placement of the headphones on the user's head, the material used in ear pads of cans of the headphones, the cushioning of the ear pads, the effectiveness of a headband over the top of the user's head to hold the cans in place, the size of the user's head, and the size of the user's ears are all factors that affect variability of the degree of acoustical coupling.

For expository purposes, the term "loose coupling" as used in this specification generally denotes a particular degree of acoustical coupling in which a headphone is not pushed firmly, tightly, or closely towards a user's ear when the headphone is placed over the user's ear, around the user's ear, or inside an ear canal of the user's ear, resulting in a loose coupling between the headphone and a cavity formed from the headphone and the user's ear including the ear canal.

For expository purposes, the term "tight coupling" as used in this specification generally denotes a particular degree of acoustical coupling in which a headphone is pushed firmly, tightly, or closely towards a user's ear when the headphone is placed over the user's ear, around the user's ear, or inside an ear canal of the user's ear, resulting in a tight coupling between the headphone and a cavity formed from the headphone and the user's ear including the ear canal.

Figure 5:
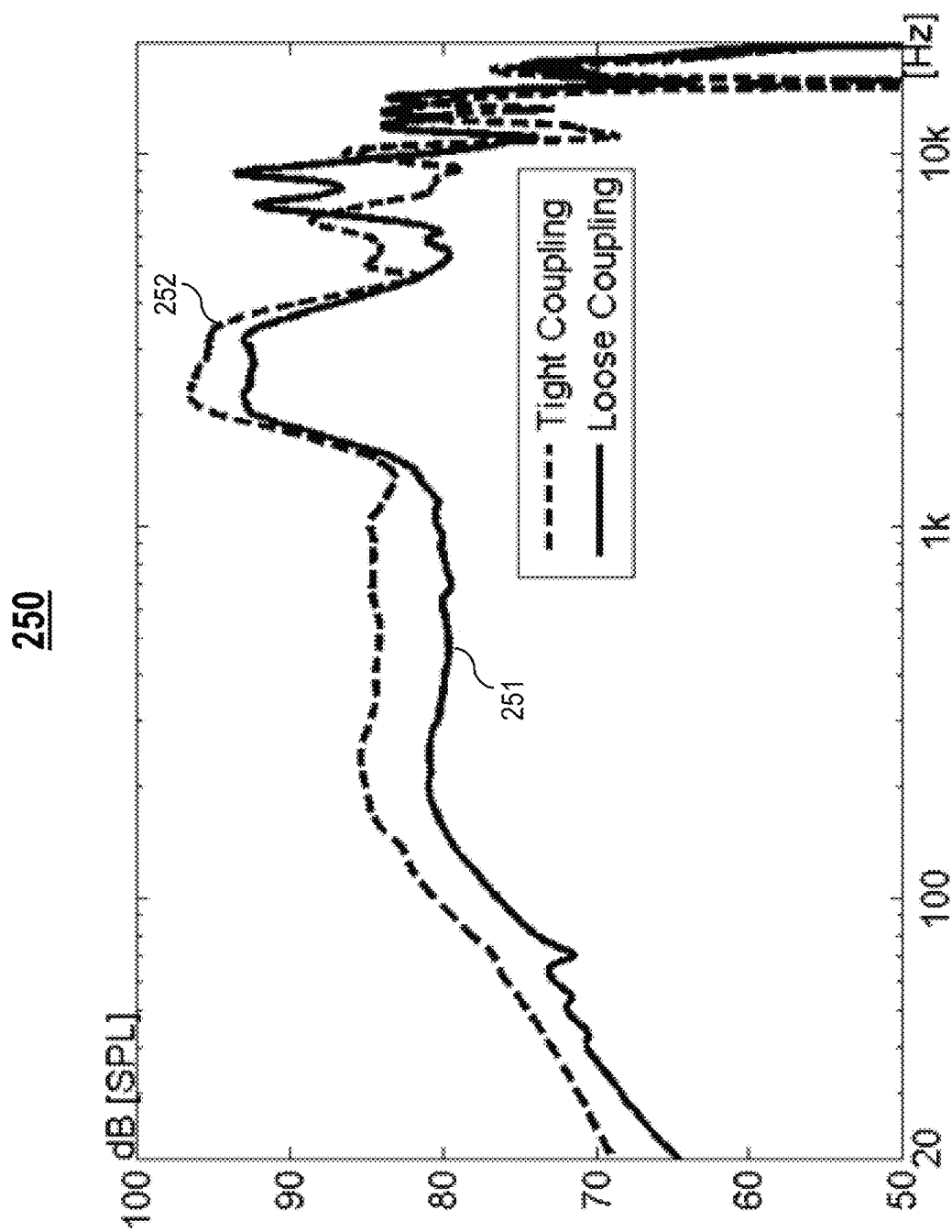
FIG. 5 is an example graph illustrating different frequency responses of a circumaural closed-back headphone on a head and torso simulator with an artificial ear coupler.

FIG. 5 is an example graph 250 illustrating different frequency responses of a circumaural closed-back headphone on a head and torso simulator with an artificial ear coupler (i.e., eardrum simulator). A horizontal axis of the graph 250 represents frequency in Hertz (Hz). A vertical axis of the graph 250 represents sound pressure level in dB. The graph 250 comprises each of the following: (1) a first curve 251 representing a frequency response of sound pressure level at the ear coupler when there is tight coupling between the headphone and a cavity formed from the headphone and the ear coupler including ear canal, and (2) a second curve 252 representing a frequency response of sound pressure level at the ear coupler when there is loose coupling between the headphone and the cavity.

Each curve 251, 252 is a measurement of sound pressure level sensed by the ear coupler, and obtained by reproducing, via a headphone driver of the headphone, an input signal (e.g., a test signal) with the same input voltage. As shown in FIG. 5, a frequency response of the headphone with tight coupling (i.e., curve 252) is higher.

Figure 6:
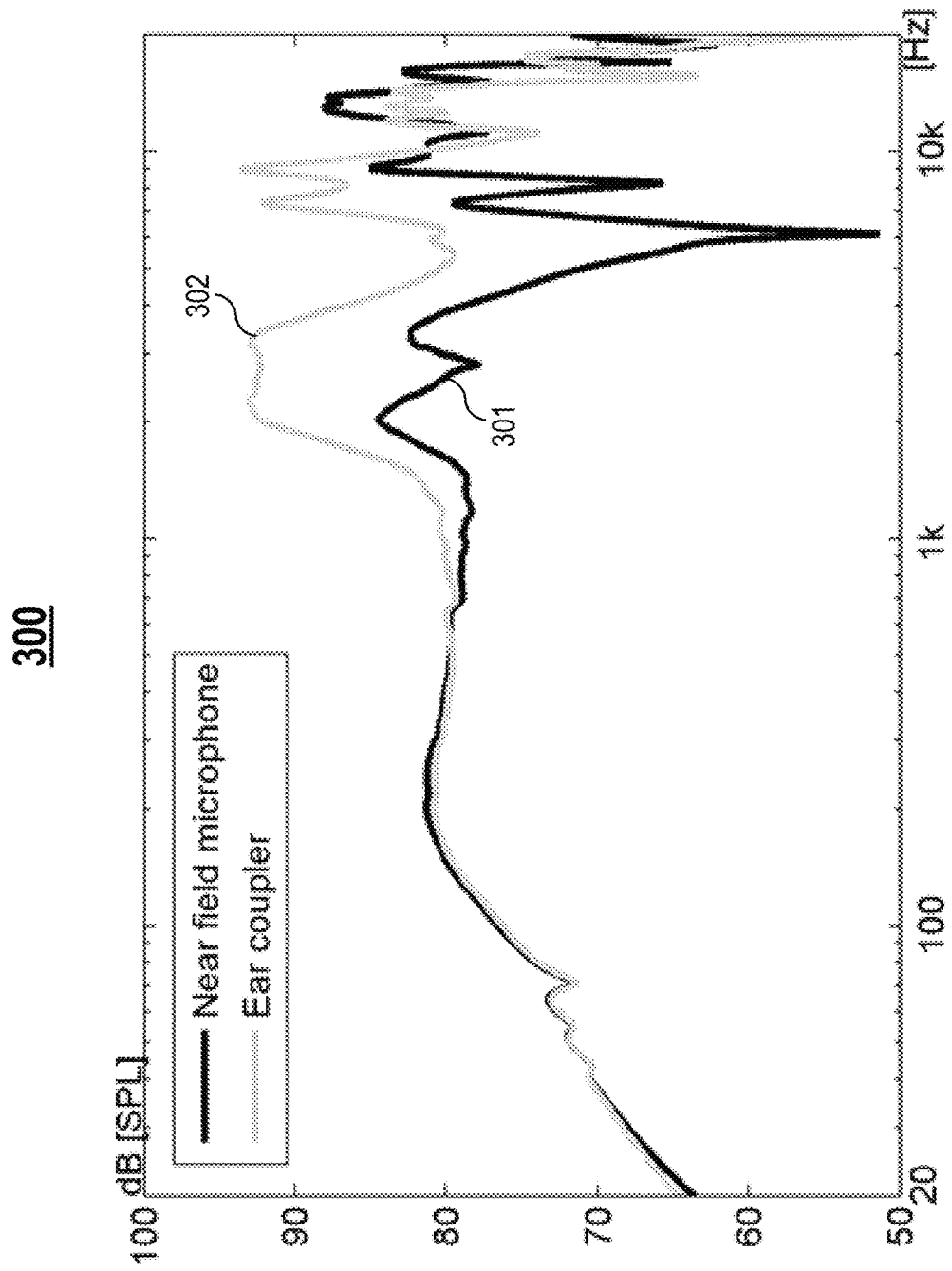
FIG. 6 is an example graph illustrating frequency response of the circumaural closed-back headphone (FIG. 3) with loose coupling on a head and torso simulator with an artificial ear coupler, in accordance with an embodiment.

FIG. 6 is an example graph 300 illustrating frequency response of the circumaural closed-back headphone 220 (FIG. 3) with loose coupling on a head and torso simulator with an artificial ear coupler, in accordance with an embodiment. A horizontal axis of the graph 300 represents frequency in Hz. A vertical axis of the graph 300 represents sound pressure level in dB. The graph 300 comprises each of the following: (1) a first curve 301 representing a frequency response of sound pressure level at the near field microphone 222 (FIG. 3) when there is loose coupling between the headphone 220 and a cavity formed from the headphone 220 and the ear coupler including ear canal, and (2) a second curve 302 representing a frequency response of sound pressure level at the ear coupler when there is loose coupling between the headphone 220 and the cavity.

The curves 301 and 302 are different measurements of sound pressure level at different points inside the cavity, simultaneously sensed using different sensors. Specifically, the first curve 301 is a first measurement of sound pressure level at the headphone driver 221 (FIG. 3), sensed by the near field microphone 222. The second curve 302 is a second measurement of sound pressure level at an end of the ear canal, sensed by the ear coupler.

As shown in FIG. 6, the curves 301 and 302 are similar from 20 Hz to 800 Hz. The curves 301 and 302 start to separate from each other from about 800 Hz onwards. The curves 301 and 302 have similar tendency between 800 Hz and 1800 Hz. The curves 301 and 302 have similar response and tendency between 9000 Hz to 20000 Hz.

As shown in FIG. 6, a peak in the first curve 301 at about 2000 Hz represents an electro-acoustic system resonance. In one embodiment, a main equalization filter $EQ_{main}$ constructed by the system 100 (e.g., via the main equalization unit 130) is applied to provide individualized headphone equalization from 20 Hz to 2000 Hz to improve sound quality of output reproduced via the headphone driver 221.

Figure 7:
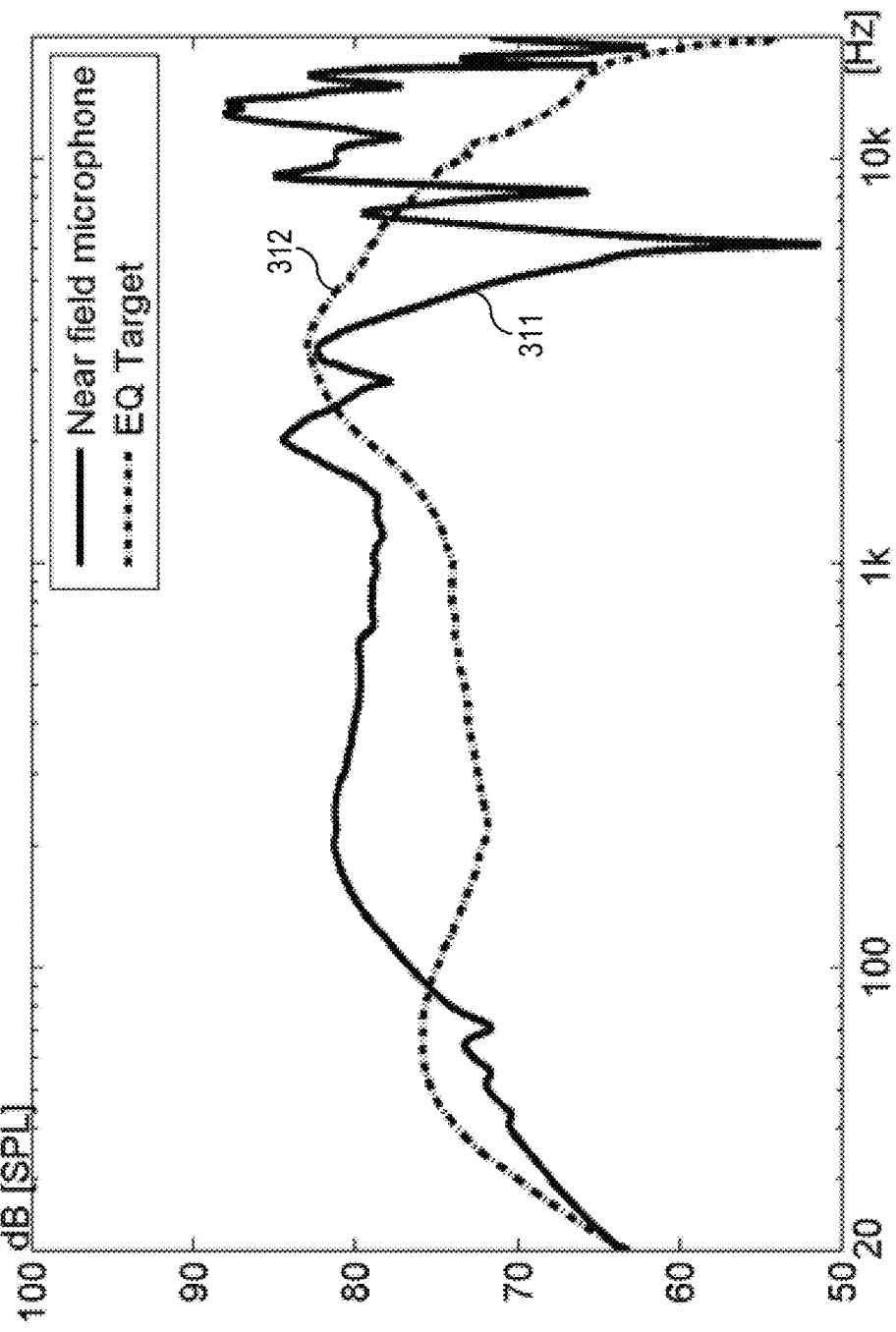
FIG. 7 is an example graph illustrating a pre-determined target frequency response for the circumaural closed-back headphone (FIG. 3) with loose coupling on a head and torso simulator with an artificial ear coupler, in accordance with an embodiment.

FIG. 7 is an example graph 310 illustrating a pre-determined target frequency response for the circumaural closed-back headphone 220 (FIG. 3) with loose coupling on a head and torso simulator with an artificial ear coupler, in accordance with an embodiment. A horizontal axis of the graph 310 represents frequency in Hz. A vertical axis of the graph 310 represents sound pressure level in dB. The graph 310 comprises each of the following: (1) a first curve 311 representing a frequency response of sound pressure level at the near field microphone 222 (FIG. 3) when there is loose coupling between the headphone 220 and a cavity formed from the headphone 220 and the ear coupler including ear canal, and (2) a second curve 312 representing a pre-determined target frequency response for the headphone 220.

Figure 8:
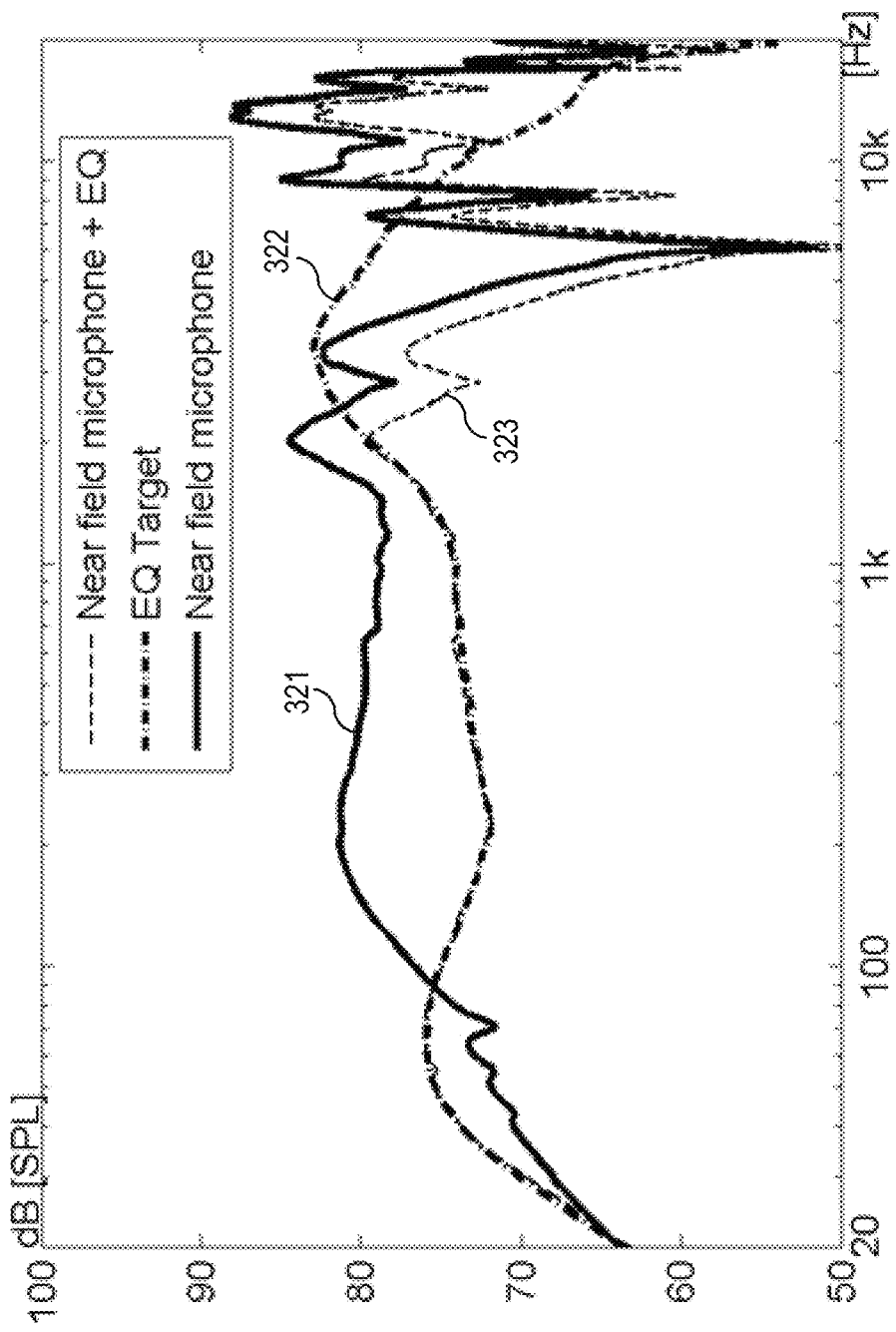
FIG. 8 is an example graph illustrating equalized frequency response of the circumaural closed-back headphone (FIG. 3) with loose coupling on a head and torso simulator with an artificial ear coupler, in accordance with an embodiment.

FIG. 8 is an example graph 320 illustrating equalized frequency response of the circumaural closed-back headphone 220 (FIG. 3) with loose coupling on a head and torso simulator with an artificial ear coupler, in accordance with an embodiment. A horizontal axis of the graph 320 represents frequency in Hz. A vertical axis of the graph 320 represents sound pressure level in dB. The graph 320 comprises each of the following: (1) a first curve 321 representing a frequency response of sound pressure level at the near field microphone 222 (FIG. 3) when there is loose coupling between the headphone 220 and a cavity formed from the headphone 220 and the ear coupler including ear canal, (2) a second curve 322 representing a pre-determined target frequency response for the headphone 220, and (3) a third curve 323 representing a frequency response of sound pressure level at the near field microphone 222 after equalization. The third curve 323 is an equalized frequency response resulting from performing EQ correction in accordance with the pre-determined target frequency response (e.g., using a main equalization filter $EQ_{main}$ constructed by the system 100).

Figure 9:
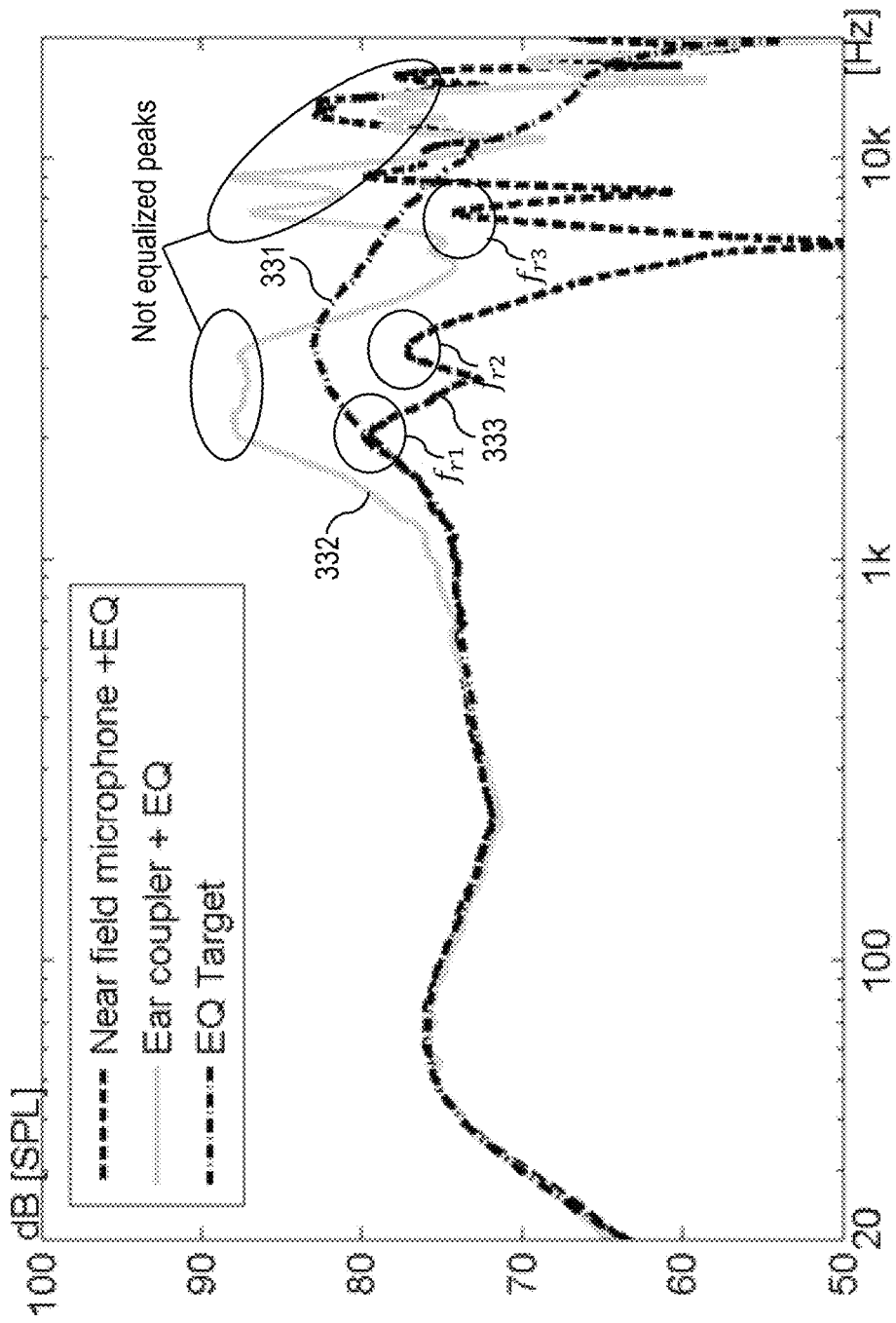
FIG. 9 is an example graph illustrating different equalized frequency responses of the circumaural closed-back headphone (FIG. 3) with loose coupling on a head and torso simulator with an artificial ear coupler, in accordance with an embodiment.

FIG. 9 is an example graph 330 illustrating different equalized frequency responses of the circumaural closed-back headphone 220 (FIG. 3) with loose coupling on a head and torso simulator with an artificial ear coupler, in accordance with an embodiment. A horizontal axis of the graph 330 represents frequency in Hz. A vertical axis of the graph 330 represents sound pressure level in dB. The graph 330 comprises each of the following: (1) a first curve 331 representing a pre-determined target frequency response for the headphone 220, (2) a second curve 332 representing a frequency response of sound pressure level at the ear coupler after equalization, and (3) a third curve 333 representing a frequency response of sound pressure level at the near field microphone 222 (FIG. 3) after equalization. Both the second curve 332 and the third curve 333 are equalized frequency responses resulting from performing EQ correction in accordance with the pre-determined target frequency response (e.g., using a main equalization filter $EQ_{main}$ constructed by the system 100).

As shown in FIG. 9, after equalization, a frequency response of the headphone 220 is corrected towards the pre-determined target response up to around 800 Hz (i.e., the second curve 332 substantially matches the first curve 331 up to around 800 Hz), and starts to deviate from the pre-determined target response as frequency increases.

As shown in FIG. 9, after equalization, there is a boost of about 6 dB to 8 dB at around 2000 Hz and 3000 Hz, and some peaks in the frequency response of the headphone 220 are left higher than a nominal frequency response around 7000 Hz to 10000 Hz (see non-equalized peaks in the second curve 332).

As shown in FIG. 9, a first peak $f_{r1}$ in the third curve 333 at about 2000 Hz represents an electro-acoustic system resonance. Each subsequent peak $f_{r2}$ and $f_{r3}$ in the third curve 333 after 2000 Hz also represent another electro-acoustic system resonance.

Figure 10:
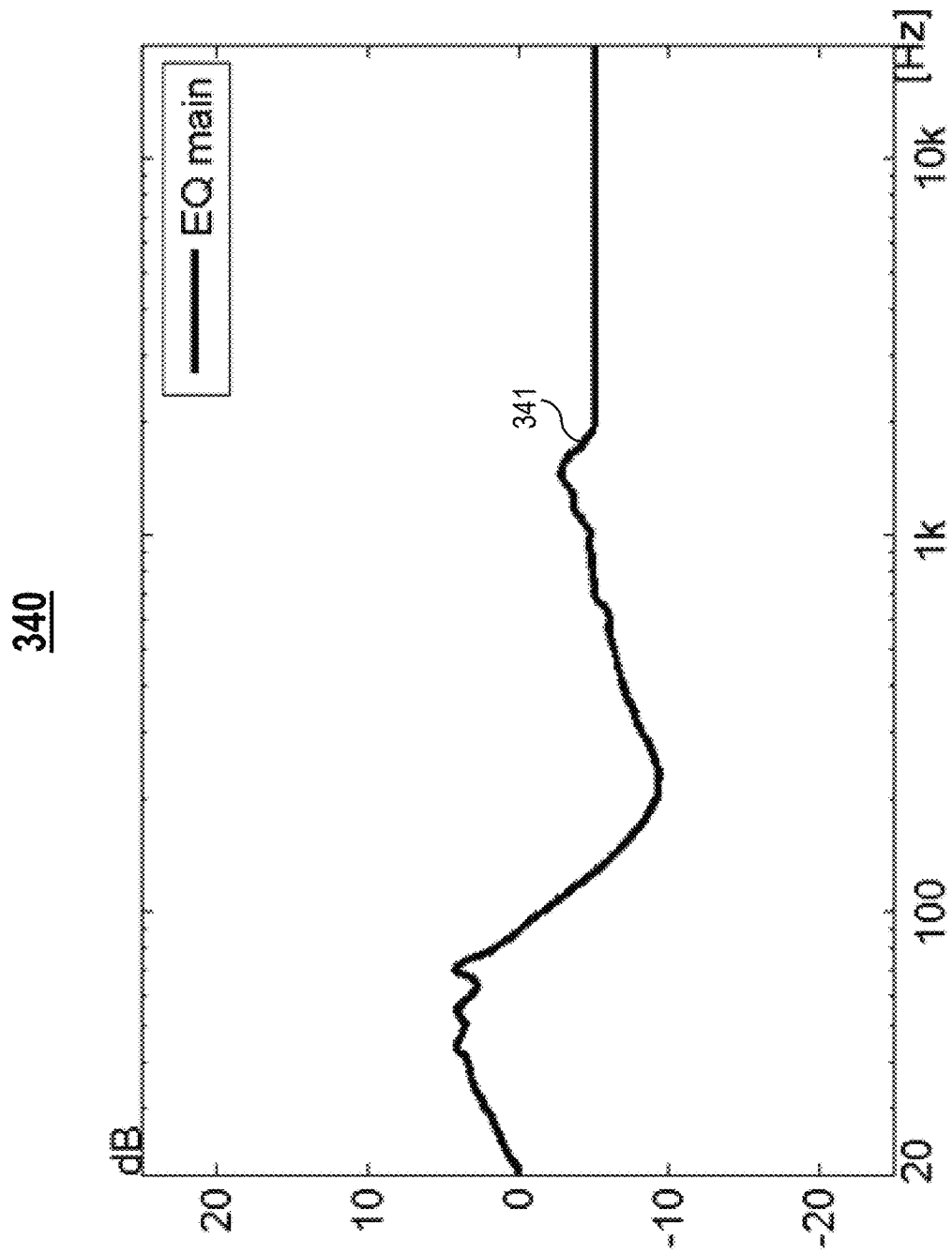
FIG. 10 is an example graph illustrating frequency response of a main equalization filter $EQ_{main}$ constructed by the system (FIG. 1), in accordance with an embodiment.

FIG. 10 is an example graph 340 illustrating frequency response of a main equalization filter $EQ_{main}$ constructed by the system 100 (FIG. 1), in accordance with an embodiment. A horizontal axis of the graph 340 represents frequency in Hz. A vertical axis of the graph 340 represents sound pressure level in dB. The graph 340 comprises a curve 341 representing the frequency response of the main equalization filter $EQ_{main}$. As shown in FIG. 10, the frequency response of the main equalization filter $EQ_{main}$ is equal to a constant value from 2000 Hz to 20000 Hz.

In one embodiment, the system is configured to: (1) detect an electro-acoustic system resonance $f_c$ based on a frequency response of sound pressure reproduced by a headphone, and (2) perform additional equalization to compensate for the electro-acoustic system resonance $f_c$ (e.g., ear canal resonance equalization) from about 2000 Hz to about 20000 Hz, resulting in an equalized frequency response that more closely matches the pre-determined target response.

Figure 11:
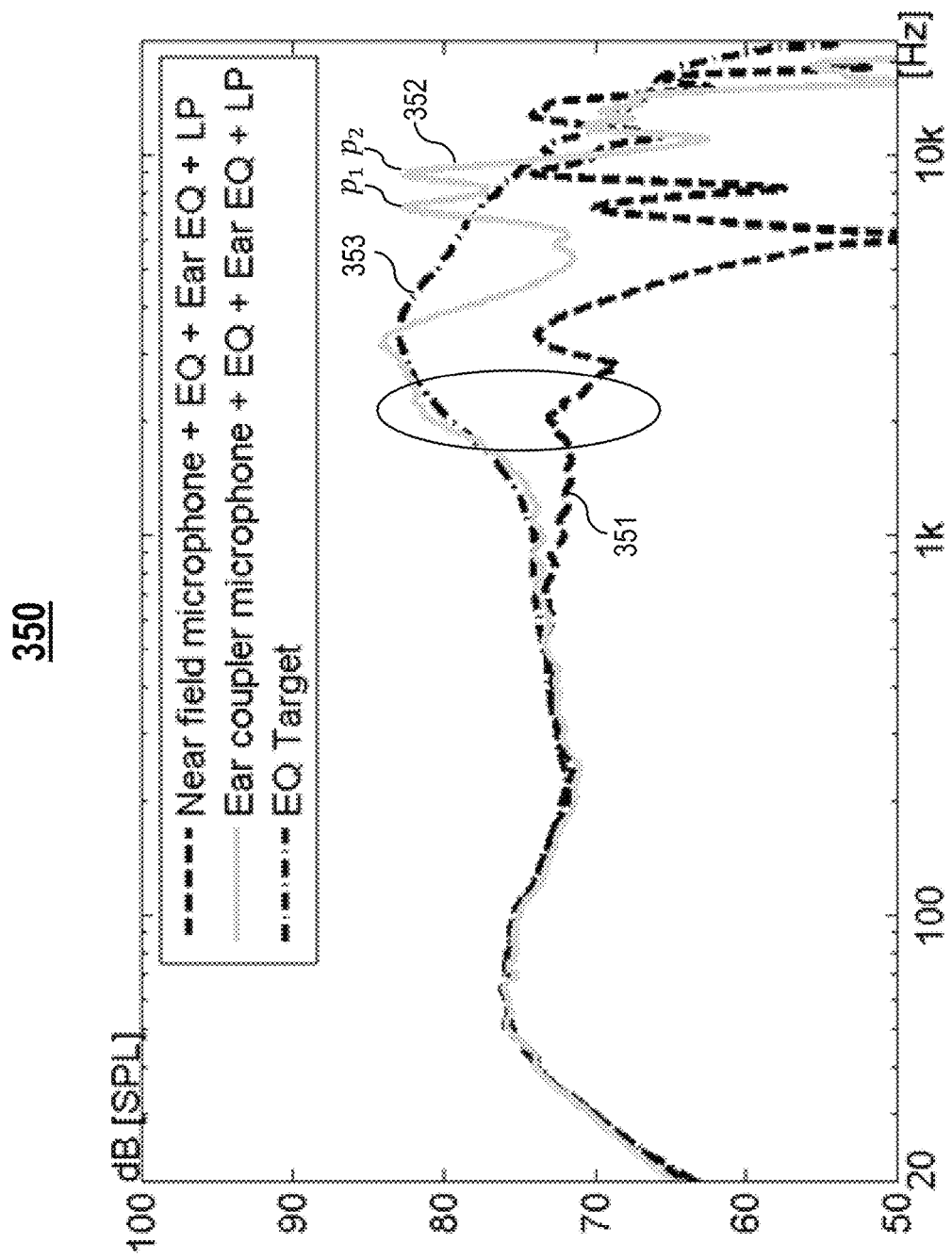
FIG. 11 is an example graph illustrating frequency response of a circumaural closed-back headphone (FIG. 3) with loose coupling on a head and torso simulator with an artificial ear coupler, after personalized headphone equalization, electro-acoustic system resonance equalization and low pass filtering, in accordance with an embodiment.

FIG. 11 is an example graph 350 illustrating frequency response of a circumaural closed-back headphone 220 (FIG. 3) with loose coupling on a head and torso simulator with an artificial ear coupler, after personalized headphone equalization, electro-acoustic system resonance equalization and low pass filtering, in accordance with an embodiment. A horizontal axis of the graph 350 represents frequency in Hz. A vertical axis of the graph 350 represents sound pressure level in dB. The graph 350 comprises each of the following: (1) a first curve 351 representing a pre-determined target frequency response for the headphone 220, (2) a second curve 352 representing frequency response of sound pressure level at the ear coupler after personalized headphone equalization, electro-acoustic system resonance equalization and low pass filtering, and (3) a third curve 353 representing a frequency response of sound pressure level at the near field microphone 222 (FIG. 3) after personalized headphone equalization, electro-acoustic system resonance equalization and low pass filtering. Both the second curve 352 and the third curve 353 are equalized frequency responses resulting from applying a main equalization filter $EQ_{main}$ constructed by the system 100, adding a PEQ filter $PEQ_{fr}$ constructed by the system 100 to the main equalization filter $EQ_{main}$, and adding a low pass filter $LP_{fc}$ constructed by the system 100 to the main equalization filter $EQ_{main}$.

As shown in FIG. 11, after the electro-acoustic system resonance equalization and low pass filtering, the equalized frequency response of the headphone 220 is corrected towards the pre-determined target response up to around 3500 Hz (i.e., the second curve 352 more closely matches the first curve 351 up to around 3500 Hz). From 7000 Hz up to 15000 Hz, the equalized frequency response of the headphone 220 is close to the pre-determined target response.

As shown in FIG. 11, the equalized frequency response includes non-equalized peaks $p_1$ and $p_2$ at about 7350 Hz and 8900 Hz, respectively. In one embodiment, the system determines not to equalize some high peaks (e.g., $p_1$ and $p_2$) in a frequency response of a headphone because these peaks require a first order low pass filter with a very high Q.

Figure 12:
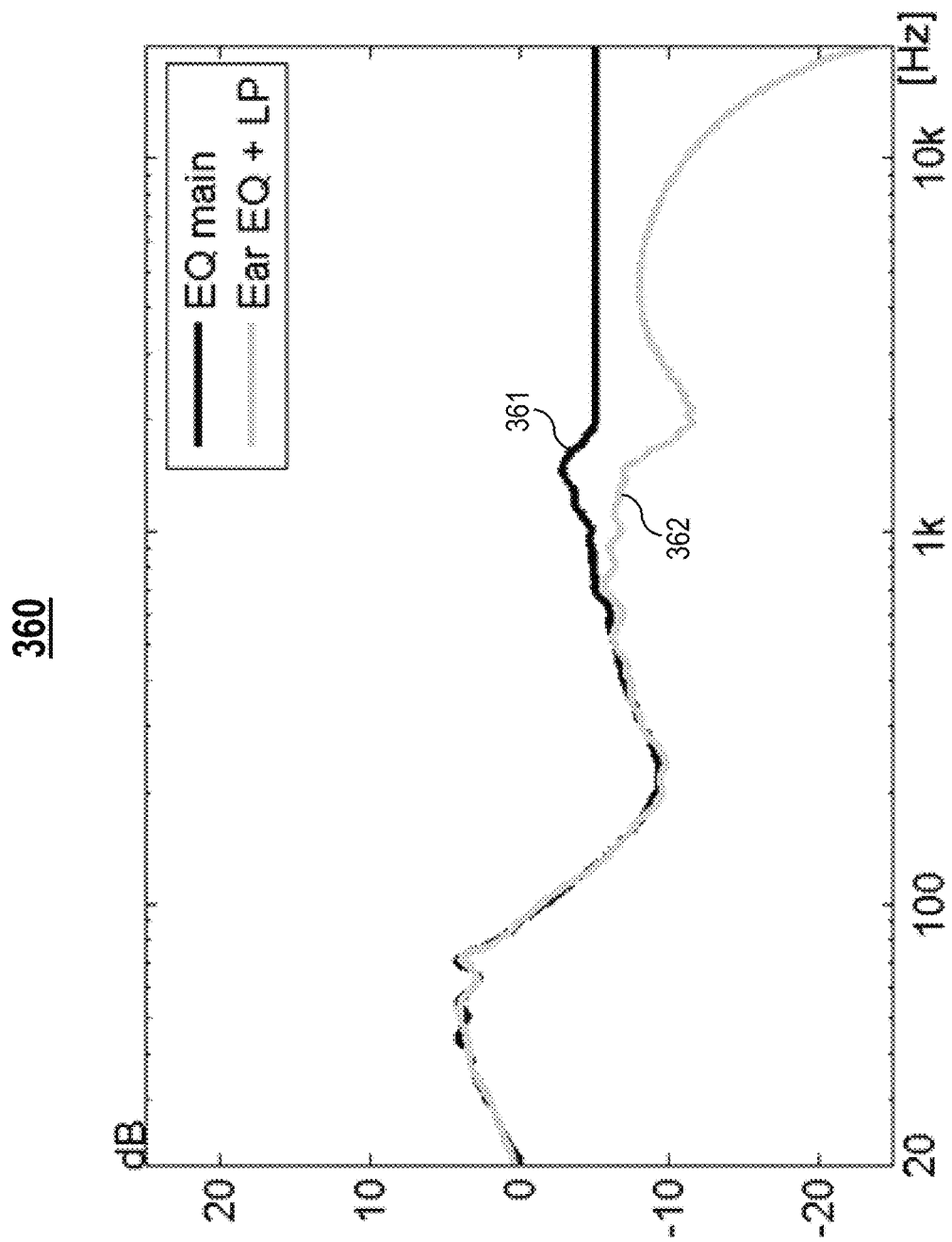
FIG. 12 is an example graph illustrating frequency response of a main equalization filter $EQ_{main}$ constructed by the system (FIG. 1), with electro-acoustic system resonance equalization and low pass filtering added, in accordance with an embodiment.

FIG. 12 is an example graph 360 illustrating frequency response of a main equalization filter $EQ_{main}$ constructed by the system 100 (FIG. 1), with electro-acoustic system resonance equalization and low pass filtering added, in accordance with an embodiment. A horizontal axis of the graph 360 represents frequency in Hz. A vertical axis of the graph 360 represents sound pressure level in dB. The graph 360 comprises: (1) a first curve 361 representing a frequency response of the main equalization filter $EQ_{main}$ without electro-acoustic system resonance equalization and low pass filtering added, and (2) a second curve 362 representing the frequency response of the main equalization filter $EQ_{main}$ with electro-acoustic system resonance equalization and low pass filtering added (i.e., $EQ_{final}$, as represented by equation (5) provided above).

Figure 13:
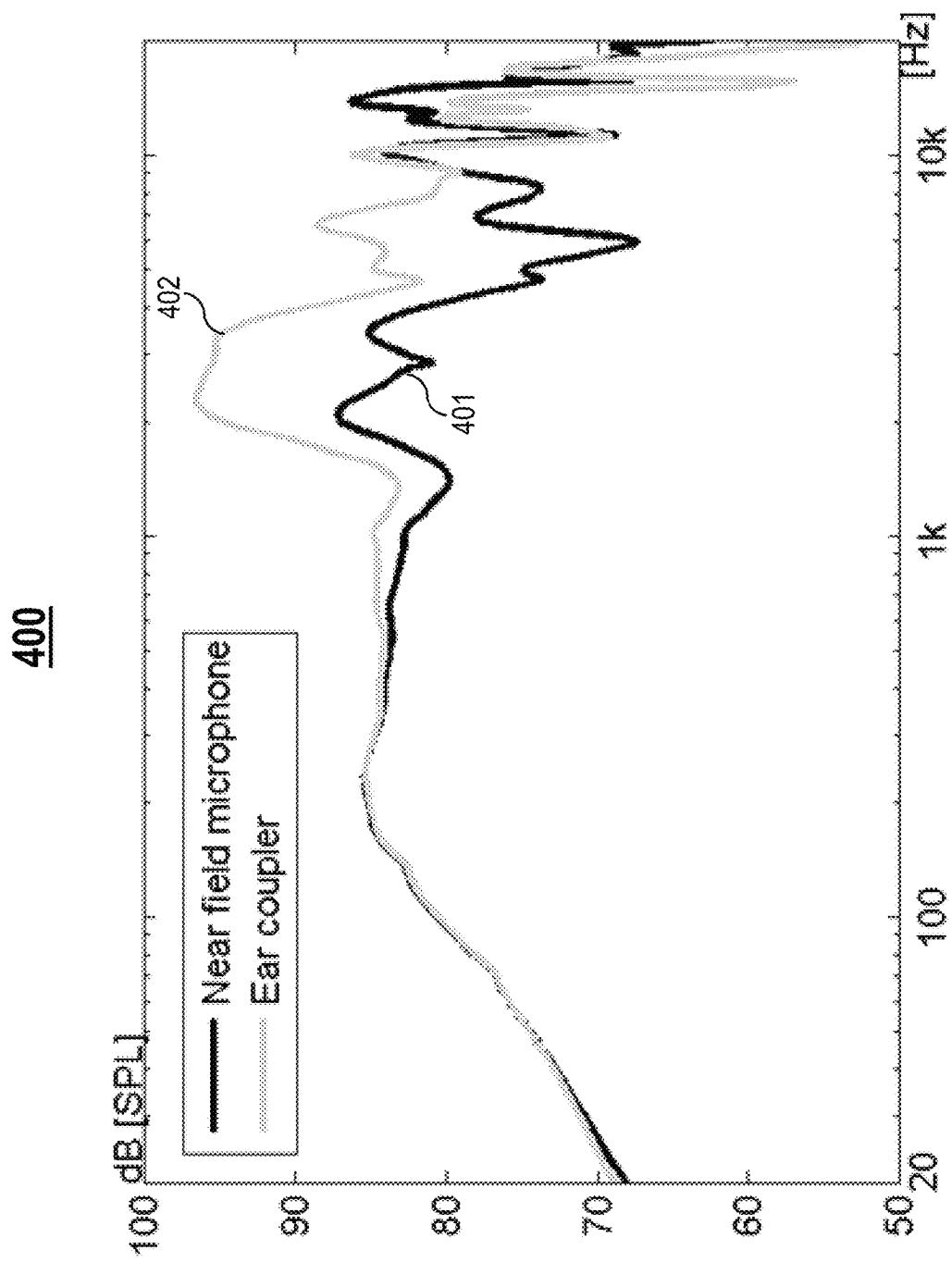
FIG. 13 is an example graph illustrating frequency response of the circumaural closed-back headphone (FIG. 3) with tight coupling on a head and torso simulator with an artificial ear coupler, in accordance with an embodiment.

FIG. 13 is an example graph 400 illustrating frequency response of the circumaural closed-back headphone 220 (FIG. 3) with tight coupling on a head and torso simulator with an artificial ear coupler, in accordance with an embodiment. A horizontal axis of the graph 400 represents frequency in Hz. A vertical axis of the graph 400 represents sound pressure level in dB. The graph 400 comprises each of the following: (1) a first curve 401 representing a frequency response of sound pressure level at the near field microphone 222 (FIG. 3) when there is tight coupling between the headphone 220 and a cavity formed from the headphone 220 and the ear coupler including ear canal, and (2) a second curve 402 representing a frequency response of sound pressure level at the ear coupler when there is tight coupling between the headphone 220 and the cavity.

Figure 14:
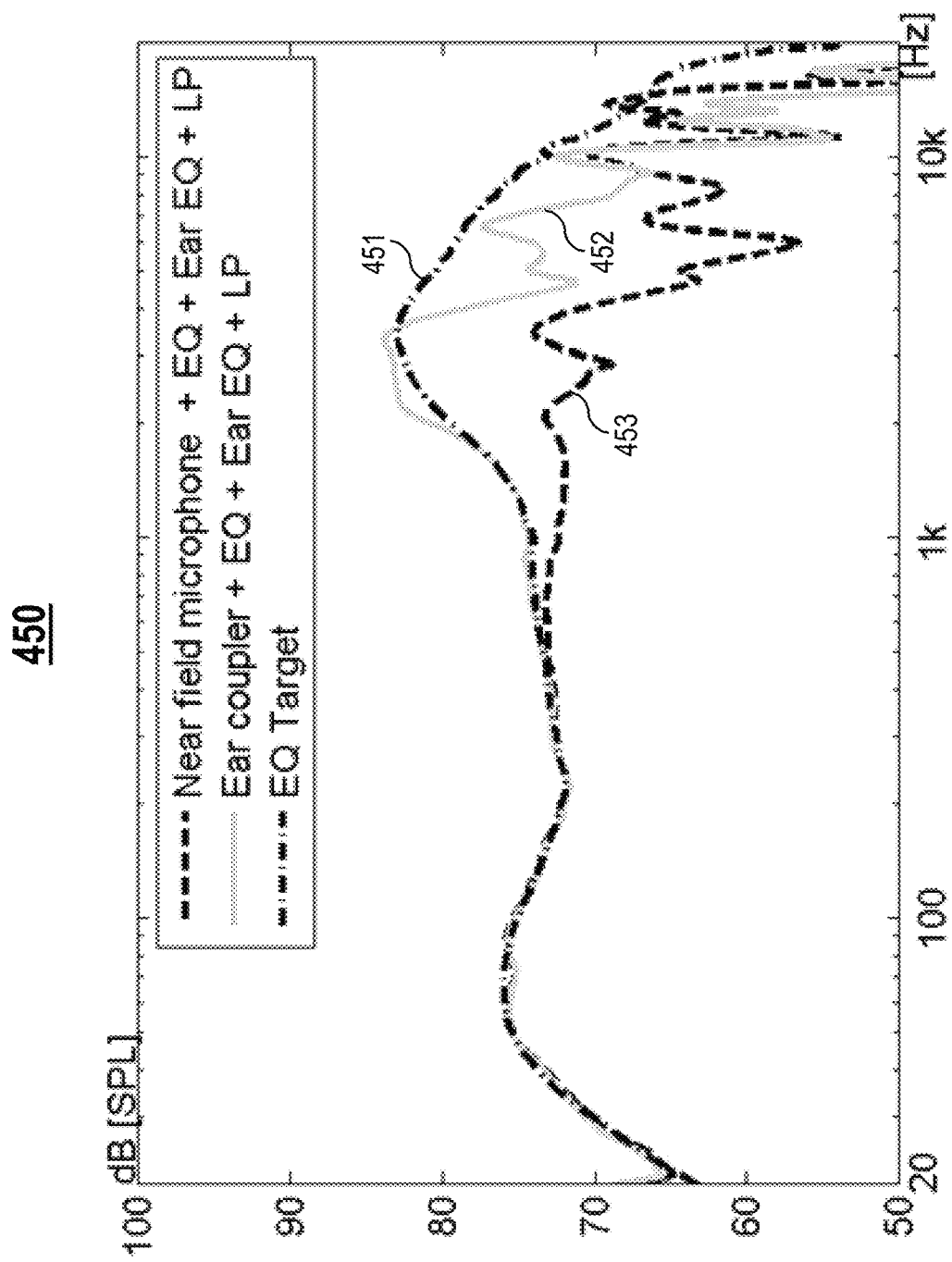
FIG. 14 is an example graph illustrating frequency response of a circumaural closed-back headphone (FIG. 3)

FIG. 14 is an example graph 450 illustrating frequency response of a circumaural closed-back headphone 220 (FIG. 3) with tight coupling on a head and torso simulator with an artificial ear coupler, after personalized headphone equalization, electro-acoustic system resonance equalization and low pass filtering, in accordance with an embodiment. A horizontal axis of the graph 450 represents frequency in Hz. A vertical axis of the graph 450 represents sound pressure level in dB. The graph 450 comprises each of the following: (1) a first curve 451 representing a pre-determined target frequency response for the headphone 220, (2) a second curve 452 representing frequency response of sound pressure level at the ear coupler after personalized headphone equalization, electro-acoustic system resonance equalization and low pass filtering, and (3) a third curve 453 representing a frequency response of sound pressure level at the near field microphone 222 (FIG. 3) after personalized headphone equalization, electro-acoustic system resonance equalization and low pass filtering. Both the second curve 452 and the third curve 453 are equalized frequency responses resulting from applying a main equalization filter $EQ_{main}$ constructed by the system 100, adding a PEQ filter $PEQ_{fr}$ constructed by the system 100 to the main equalization filter $EQ_{main}$, and adding a low pass filter $LP_{fc}$ constructed by the system 100 to the main equalization filter $EQ_{main}$.

FIG. 15 is an example graph 500 illustrating frequency response of the circumaural open-back headphone 230 (FIG. 4) with loose coupling on a head and torso simulator with an artificial ear coupler, in accordance with an embodiment. A horizontal axis of the graph 500 represents frequency in Hz. A vertical axis of the graph 500 represents sound pressure level in dB. The graph 500 comprises each of the following: (1) a first curve 501 representing a frequency response of sound pressure level at the near field microphone 232 (FIG. 4) when there is loose coupling between the headphone 230 and a cavity formed from the headphone 230 and the ear coupler including ear canal, and (2) a second curve 502 representing a frequency response of sound pressure level at the ear coupler when there is loose coupling between the headphone 230 and the cavity.

As shown in FIG. 15, the curves 501 and 502 are similar from 20 Hz to 800 Hz.

FIG. 16 is an example graph 550 illustrating frequency response of a circumaural open-back headphone 230 (FIG. 4) with loose coupling on a head and torso simulator with an artificial ear coupler, after personalized headphone equalization, electro-acoustic system resonance equalization and low pass filtering, in accordance with an embodiment. A horizontal axis of the graph 550 represents frequency in Hz. A vertical axis of the graph 550 represents sound pressure level in dB. The graph 550 comprises each of the following: (1) a first curve 551 representing a pre-determined target frequency response for the headphone 230, (2) a second curve 552 representing frequency response of sound pressure level at the ear coupler after personalized headphone equalization, electro-acoustic system resonance equalization and low pass filtering, and (3) a third curve 553 representing a frequency response of sound pressure level at the near field microphone 232 (FIG. 4) after personalized headphone equalization, electro-acoustic system resonance equalization and low pass filtering. Both the second curve 552 and the third curve 553 are equalized frequency responses resulting from applying a main equalization filter $EQ_{main}$ constructed by the system 100, adding a PEQ filter $PEQ_{fr}$ constructed by the system 100 to the main equalization filter $EQ_{main}$, and adding a low pass filter $LP_{fc}$ constructed by the system 100 to the main equalization filter $EQ_{main}$.

FIG. 17 is an example graph 600 illustrating frequency response of the circumaural open-back headphone 230 (FIG. 4) with tight coupling on a head and torso simulator with an artificial ear coupler, in accordance with an embodiment. A horizontal axis of the graph 600 represents frequency in Hz. A vertical axis of the graph 600 represents sound pressure level in dB. The graph 600 comprises each of the following: (1) a first curve 601 representing a frequency response of sound pressure level at the near field microphone 232 (FIG. 4) when there is tight coupling between the headphone 230 and a cavity formed from the headphone 230 and the ear coupler including electro-acoustic system, and (2) a second curve 602 representing a frequency response of sound pressure level at the ear coupler when there is tight coupling between the headphone 230 and the cavity.

As shown in FIG. 17, the curves 601 and 602 are similar from 20 Hz to 800 Hz.

FIG. 18 is an example graph 560 illustrating frequency response of a circumaural open-back headphone 230 (FIG. 4) with tight coupling on a head and torso simulator with an artificial ear coupler, after personalized headphone equalization, electro-acoustic system resonance equalization and low pass filtering, in accordance with an embodiment. A horizontal axis of the graph 560 represents frequency in Hz. A vertical axis of the graph 560 represents sound pressure level in dB. The graph 560 comprises each of the following: (1) a first curve 651 representing a pre-determined target frequency response for the headphone 230, (2) a second curve 652 representing frequency response of sound pressure level at the ear coupler after personalized headphone equalization, electro-acoustic system resonance equalization and low pass filtering, and (3) a third curve 653 representing a frequency response of sound pressure level at the near field microphone 232 (FIG. 4) after personalized headphone equalization, electro-acoustic system resonance equalization and low pass filtering. Both the second curve 652 and the third curve 653 are equalized frequency responses resulting from applying a main equalization filter $EQ_{main}$ constructed by the system 100, adding a PEQ filter $PEQ_{fc}$ constructed by the system 100 to the main equalization filter $EQ_{main}$, and adding a low pass filter $LP_{fc}$ constructed by the system 100 to the main equalization filter $EQ_{main}$.

FIG. 19 illustrates an example in-ear earbud 670 inserted into a human ear 661 of a human user/person 660, wherein the system 100 is integrated in the in-ear earbud 670 or operates on an electronic device connected to the in-ear earbud 670, in accordance with an embodiment. As shown in FIG. 19, the in-ear earbud 670 is inserted via an external part 664 of the human ear 661, such that a portion of the in-ear earbud 670 is disposed inside a portion of an ear canal 662 of the human ear 661. A cavity 675 is formed by the in-ear earbud 670 and an ear drum 663 that separates the ear canal 662 from an internal part 665 of the human ear. The in-ear earbud 670 comprises: (1) a headphone driver 671 for reproducing audio, and (2) a near field microphone 672 for sensing sound pressure levels inside the cavity 675 at discrete frequencies. In one embodiment, the microphone 672 is mounted in the near field of a diaphragm of the headphone driver 671.

FIG. 20 illustrates the example in-ear earbud 670 inserted into a head and torso simulator 680, in accordance with an embodiment. As shown in FIG. 20, the in-ear earbud 670 is inserted via an anthropometric pinna 684 of the simulator 680, such that a portion of the in-ear earbud 670 is disposed inside a portion of an anthropometric ear canal 682 of the simulator 680. A cavity 685 is formed by the in-ear earbud 670 and an ear drum simulator 683 of the simulator 680, wherein the ear drum simulator 683 is disposed at an end of the ear canal 682.

In one embodiment, the head and torso simulator 680 represents an average human user/person. Let $ED_{est}$ generally denote an eardrum estimation filter representing an estimation of acoustic frequency response at an ear drum of a human ear. In one embodiment, the system 100 is configured to compute the eardrum estimation filter $ED_{est}$ in accordance with equation (6) provided below:

$$ED_{est} = ED_{sim} - NF \qquad (6),$$

wherein $ED_{sim}$ is a frequency response at the eardrum simulator 683 in dB, and NF is a frequency response at the near field microphone 672 in dB.

FIG. 21 is an example graph 800 illustrating frequency response of the in-ear earbud 670 (FIG. 20) when inserted into the head and torso simulator 680, in accordance with an embodiment. A horizontal axis of the graph 800 represents frequency in Hz. A vertical axis of the graph 800 represents sound pressure level in dB. The graph 800 comprises each of the following: (1) a first curve 801 representing a frequency response of sound pressure level at the eardrum simulator 683 (i.e., $ED_{sim}$), (2) a second curve 802 representing a frequency response of sound pressure level at the near field microphone 672 (FIG. 20), and (3) a third curve 803 representing a frequency response of an eardrum estimation filter (i.e., $ED_{est}$) (with 60 dB added for visualization purposes).

In one embodiment, based on the eardrum estimation filter $ED_{est}$ computed, the system 100 is configured to construct an equalization filter to a pre-determined target frequency response for the in-ear earbud 670. For example, in one embodiment, the system 100 adds the eardrum estimation filter $ED_{est}$ to a measured frequency response of sound pressure level at the near field microphone 272.

FIG. 22 is an example graph 810 illustrating a pre-determined target frequency response for the in-ear earbud 670 (FIG. 19) when inserted into the human ear, in accordance with an embodiment. A horizontal axis of the graph 810 represents frequency in Hz. A vertical axis of the graph 810 represents sound pressure level in dB. The graph 810 comprises each of the following: (1) a first curve 811 representing the estimated frequency response at the eardrum when the in-ear earbud 670 is inserted into a left human ear, (2) a second curve 812 representing the estimated frequency response at the eardrum when the in-ear earbud 670 is inserted into a right human ear, (3) a third curve 813 representing a frequency response of sound pressure level at the near field microphone 672 (FIG. 19) when the in-ear earbud 670 is inserted into the left human ear, (4) a fourth curve 814 representing a frequency response of sound pressure level at the near field microphone 672 (FIG. 19) when the in-ear earbud 670 is inserted into the right human ear, and (5) a fifth curve 815 representing a pre-determined target frequency response for the in-ear earbud 670.

FIG. 23 is an example graph 820 illustrating equalized frequency response of the in-ear earbud 670 (FIG. 19) when inserted into the human ear, in accordance with an embodiment. A horizontal axis of the graph 820 represents frequency in Hz. A vertical axis of the graph 820 represents sound pressure level in dB. The graph 820 comprises each of the following: (1) a first curve 821 representing the estimated equalized frequency response at the eardrum when the in-ear earbud 670 is inserted into a left human ear, (2) a second curve 822 representing the estimated equalized frequency response at the eardrum when the in-ear earbud 670 is inserted into a right human ear, (3) a third curve 823 representing an equalized frequency response of sound pressure level at the near field microphone 672 (FIG. 19) when the in-ear earbud 670 is inserted into the left human ear, (4) a fourth curve 824 representing an equalized frequency response of sound pressure level at the near field microphone 672 (FIG. 19) when the in-ear earbud 670 is inserted into the right human ear, and (5) a fifth curve 825 representing a pre-determined target frequency response for the in-ear earbud 670. The curves 821-824 are equalized frequency responses resulting from performing EQ correction in accordance with the pre-determined target frequency response (e.g., using an equalization filter constructed by the system 100).

FIG. 24 is an example flowchart of a process 700 for personalized headphone equalization, in accordance with an embodiment. Process block 701 includes obtaining a measurement of sound pressure level at a microphone mounted in a near field of a headphone driver of a headphone and inside a cavity formed by the headphone and a user's ear. Process block 702 includes providing personalized EQ of output reproduced via a headphone driver by performing EQ correction of the output based on the measurement of sound pressure level and a pre-determined target frequency response for the headphone, resulting in an equalized output that is adapted to individual characteristics of the user's ear.

In one embodiment, one or more components of the personalized headphone equalization system 100 are configured to perform process blocks 701-702.

FIG. 25 is a high-level block diagram showing an information processing system comprising a computer system 1700 useful for implementing various disclosed embodiments. The computer system 1700 includes one or more processors 1701, and can further include an electronic display device 1702 (for displaying video, graphics, text, and other data), a main memory 1703 (e.g., random access memory (RAM)), storage device 1704 (e.g., hard disk drive), removable storage device 1705 (e.g., removable storage drive, removable memory module, a magnetic tape drive, optical disk drive, computer readable medium having stored therein computer software and/or data), user interface device 1706 (e.g., keyboard, touch screen, keypad, pointing device), and a communication interface 1707 (e.g., modem, a network interface (such as an Ethernet card), a communications port, or a PCMCIA slot and card).

The communication interface 1707 allows software and data to be transferred between the computer system 1700 and external devices. The nonlinear controller 1700 further includes a communications infrastructure 1708 (e.g., a communications bus, cross-over bar, or network) to which the aforementioned devices/modules 1701 through 1707 are connected.

Information transferred via the communications interface 1707 may be in the form of signals such as electronic, electromagnetic, optical, or other signals capable of being received by communications interface 1707, via a communication link that carries signals and may be implemented using wire or cable, fiber optics, a phone line, a cellular phone link, a radio frequency (RF) link, and/or other communication channels. Computer program instructions representing the block diagrams and/or flowcharts herein may be loaded onto a computer, programmable data processing apparatus, or processing devices to cause a series of operations performed thereon to produce a computer implemented process. In one embodiment, processing instructions for process 700 (FIG. 24) may be stored as program instructions on the memory 1703, storage device 1704, and/or the removable storage device 1705 for execution by the processor 1701.

Embodiments have been described with reference to flowchart illustrations and/or block diagrams of methods, apparatus (systems), and computer program products. In some cases, each block of such illustrations/diagrams, or combinations thereof, can be implemented by computer program instructions. The computer program instructions when provided to a processor produce a machine, such that the instructions, which executed via the processor create means for implementing the functions/operations specified in the flowchart and/or block diagram. Each block in the flowchart/block diagrams may represent a hardware and/or software module or logic. In alternative implementations, the functions noted in the blocks may occur out of the order noted in the figures, concurrently, etc.

The terms "computer program medium," "computer usable medium," "computer readable medium," and "computer program product," are used to generally refer to media such as main memory, secondary memory, removable storage drive, a hard disk installed in hard disk drive, and signals. These computer program products are means for providing software to the computer system. The computer readable medium allows the computer system to read data, instructions, messages or message packets, and other computer readable information from the computer readable medium. The computer readable medium, for example, may include non-volatile memory, such as a floppy disk, ROM, flash memory, disk drive memory, a CD-ROM, and other permanent storage. It is useful, for example, for transporting information, such as data and computer instructions, between computer systems. Computer program instructions may be stored in a computer readable medium that can direct a computer, other programmable data processing apparatuses, or other devices to function in a particular manner, such that the instructions stored in the computer readable medium produce an article of manufacture including instructions which implement the function/act specified in the flowchart and/or block diagram block(s).

As will be appreciated by one skilled in the art, aspects of the embodiments may be embodied as a system, method or computer program product. Accordingly, aspects of the embodiments may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, aspects of the embodiments may take the form of a computer program product embodied in one or more computer readable medium(s) having computer readable program code embodied thereon.

Any combination of one or more computer readable medium(s) may be utilized. The computer readable medium may be a computer readable storage medium (e.g., a non-transitory computer readable storage medium). A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Computer program code for carrying out operations for aspects of one or more embodiments may be written in any combination of one or more programming languages, including an object oriented programming language such as Java, Smalltalk, C++, or the like, and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

In some cases, aspects of one or more embodiments are described above with reference to flowchart illustrations and/or block diagrams of methods, apparatuses (systems), and computer program products. In some instances, it will be understood that each block of the flowchart illustrations and/or block diagrams, and combinations of blocks in the flowchart illustrations and/or block diagrams, can be implemented by computer program instructions. These computer program instructions may be provided to a special purpose computer, or other programmable data processing apparatus to produce a machine, such that the instructions, which execute via the processor of the computer or other programmable data processing apparatus, create means for implementing the functions/acts specified in the flowchart and/or block diagram block(s).

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block(s).

The computer program instructions may also be loaded onto a computer, other programmable data processing apparatuses, or other devices to cause a series of operational steps to be performed on the computer, other programmable apparatuses, or other devices to produce a computer implemented process such that the instructions which execute on the computer or other programmable apparatuses provide processes for implementing the functions/acts specified in the flowchart and/or block diagram block(s).

The flowchart and block diagrams in the Figures illustrate the architecture, functionality, and operation of possible implementations of systems, methods, and computer program products according to various embodiments. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

References in the claims to an element in the singular is not intended to mean "one and only" unless explicitly so stated, but rather "one or more." All structural and functional equivalents to the elements of the above-described exemplary embodiment that are currently known or later come to be known to those of ordinary skill in the art are intended to be encompassed by the present claims. No claim element herein is to be construed under the provisions of pre-AIA 35 U.S.C. section 112, sixth paragraph, unless the element is expressly recited using the phrase "means for" or "step for."

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the embodiments has been presented for purposes of illustration and description, but is not intended to be exhaustive or limited to the embodiments in the form disclosed. Many modifications and variations will be apparent to those of ordinary skill in the art without departing from the scope and spirit of the invention.

Though the embodiments have been described with reference to certain versions thereof, however, other versions are possible. Therefore, the spirit and scope of the appended claims should not be limited to the description of the preferred versions contained herein.

What is claimed is:

1. A personalized headphone equalization system for a headphone, comprising:
   at least one processor; and
   a non-transitory processor-readable memory device storing instructions that when executed by the at least one processor causes the at least one processor to perform operations including:
      obtaining a measurement of sound pressure level at a microphone mounted in a near field of a headphone driver of the headphone and inside a cavity formed by the headphone and a user's ear; and
      providing personalized equalization (EQ) of output reproduced via the headphone driver by performing EQ correction of the output based on the measurement of sound pressure level and a pre-determined target frequency response for the headphone, resulting in an equalized output that is adapted to individual characteristics of the user's ear.

2. The system of claim 1, wherein the headphone is a closed-back headphone.

3. The system of claim 1, wherein the headphone is an open-back headphone.

4. The system of claim 1, wherein the headphone is an in-ear earbud.

5. The system of claim 1, wherein the operations further comprise:
   detecting an electro-acoustic system resonance based on the measurement of sound pressure level.

6. The system of claim 5, wherein performing EQ correction of the output based on the measurement of sound pressure level and a pre-determined target frequency response for the headphone comprises:
   constructing a main equalization filter based on the pre-determined target frequency response and the electro-acoustic system resonance detected, wherein the electro-acoustic system resonance includes at least one of an ear canal resonance or a headphone driver resonance; and
   applying the main equalization filter to the output.

7. The system of claim 6, wherein the operations further comprise:
   determining a gain and a quality factor (Q) for the electro-acoustic system resonance detected;
   constructing a parametric equalization (PEQ) filter centered on a frequency at which the electro-acoustic system resonance is detected with the gain and the Q determined; and
   adding the PEQ filter to the main equalization filter to compensate for the electro-acoustic system resonance detected.

8. The system of claim 7, wherein the operations further comprise:
constructing a low pass filter with a cut-off frequency based on a frequency at which the electro-acoustic system resonance is detected; and
adding the low pass filter to the main equalization filter to reduce a peak in a frequency response of the headphone.

9. The system of claim 8, wherein the operations further comprise:
performing a periodic routing to update at least one of the main equalization filter, the PEQ filter, and the low pass filter.

10. A method of personalized headphone equalization system for a headphone, comprising:
obtaining a measurement of sound pressure level at a microphone mounted in a near field of a headphone driver of the headphone and inside a cavity formed by the headphone and a user's ear; and
providing personalized equalization (EQ) of output reproduced via the headphone driver by performing EQ correction of the output based on the measurement of sound pressure level and a pre-determined target frequency response for the headphone, resulting in an equalized output that is adapted to individual characteristics of the user's ear.

11. The method of claim 10, wherein the headphone is a closed-back headphone.

12. The method of claim 10, wherein the headphone is an open-back headphone.

13. The method of claim 10, wherein the headphone is an in-ear earbud.

14. The method of claim 10, further comprising:
detecting an electro-acoustic system resonance based on the measurement of sound pressure level.

15. The method of claim 14, wherein performing EQ correction of the output based on the measurement of sound pressure level and a pre-determined target frequency response for the headphone comprises:
constructing a main equalization filter based on the pre-determined target frequency response and the electro-acoustic system resonance detected, wherein the electro-acoustic system resonance includes at least one of an ear canal resonance or a headphone driver resonance; and
applying the main equalization filter to the output.

16. The method of claim 15, further comprising:
determining a gain and a quality factor (Q) for the electro-acoustic system resonance detected;
constructing a parametric equalization (PEQ) filter centered on a frequency at which the electro-acoustic system resonance is detected with the gain and the Q determined; and
adding the PEQ filter to the main equalization filter to compensate for the electro-acoustic system resonance detected.

17. The method of claim 16, further comprising:
constructing a low pass filter with a cut-off frequency based on a frequency at which the electro-acoustic system resonance is detected; and
adding the low pass filter to the main equalization filter to reduce a peak in a frequency response of the headphone.

18. The method of claim 17, further comprising:
performing a periodic routing to update at least one of the main equalization filter, the PEQ filter, and the low pass filter.

19. A headphone device providing personalized headphone equalization, comprising:
a headphone driver;
a microphone mounted in a near field of the headphone driver and inside a cavity formed by the headphone device and a user's ear; and
a processor configured to:
obtain a measurement of sound pressure level at the microphone; and
provide personalized equalization (EQ) of output reproduced via the headphone driver by performing EQ correction of the output based on the measurement of sound pressure level and a pre-determined target frequency response for the headphone device, resulting in an equalized output that is adapted to individual characteristics of the user's ear.

20. The headphone device of claim 19, wherein the headphone device is one of a closed-back headphone, an open-back headphone, or an in-ear earbud.

* * * * *